(12) United States Patent
Lee

(10) Patent No.: US 9,023,701 B1
(45) Date of Patent: May 5, 2015

(54) THREE-DIMENSIONAL MEMORY AND METHOD OF FORMING THE SAME

(71) Applicant: MACRONIX International Co., Ltd., Hsinchu (TW)

(72) Inventor: Guan-Ru Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/145,162

(22) Filed: Dec. 31, 2013

(51) Int. Cl.
*H01L 21/336* (2006.01)
*H01L 29/788* (2006.01)
*H01L 27/115* (2006.01)
*H01L 21/265* (2006.01)
*H01L 29/423* (2006.01)
*H01L 21/768* (2006.01)

(52) U.S. Cl.
CPC .... *H01L 27/11582* (2013.01); *H01L 27/11556* (2013.01); *H01L 21/265* (2013.01); *H01L 29/42328* (2013.01); *H01L 29/42344* (2013.01); *H01L 29/42376* (2013.01); *H01L 21/76897* (2013.01)

(58) Field of Classification Search
CPC ............ H01L 21/76897; H01L 21/265; H01L 21/8221; H01L 29/792; H01L 29/7926; H01L 29/7881; H01L 29/42328; H01L 29/42344; H01L 29/42376; H01L 27/11528; H01L 27/11556; H01L 27/0688; H01L 27/11578; H01L 27/11582

USPC ........... 257/324, 314, 316; 438/268, 257, 591
See application file for complete search history.

(56) References Cited

U.S. PATENT DOCUMENTS

| 6,992,349 | B2 * | 1/2006 | Lee et al. ....................... 257/324 |
| 7,782,650 | B2 * | 8/2010 | Bertin et al. .................. 365/148 |
| 8,199,557 | B2 * | 6/2012 | Maejima et al. ............... 365/148 |
| 2007/0252201 | A1 * | 11/2007 | Kito et al. ...................... 257/331 |
| 2009/0310425 | A1 * | 12/2009 | Sim et al. .................. 365/185.29 |
| 2010/0320528 | A1 * | 12/2010 | Jeong et al. .................... 257/324 |
| 2011/0140070 | A1 * | 6/2011 | Kim ................................... 257/5 |

* cited by examiner

*Primary Examiner* — Nikolay Yushin
(74) *Attorney, Agent, or Firm* — J.C. Patents

(57) ABSTRACT

A method of forming a three-dimensional memory is provided. A stacked structure is patterned to form a comb structure including a bit line pad extending along a first direction and comb-teeth portions extending along a second direction. A charge storage layer is formed on top and sidewall of the comb structure. Bit lines and auxiliary gates are formed on the charge storage layer and extend along the first direction. Each bit line covers top and sidewall of partial comb-teeth portions. Auxiliary gates cover top and sidewall of edge regions of the bit line pad. The charge storage layer on top of the bit line pad is removed. The stacked structure of the bit line pad is patterned to form a stepped structure. An ion implantation is performed to the stepped structure, to form a doped region in the semiconductor layer below each step surface of the stepped structure.

22 Claims, 25 Drawing Sheets

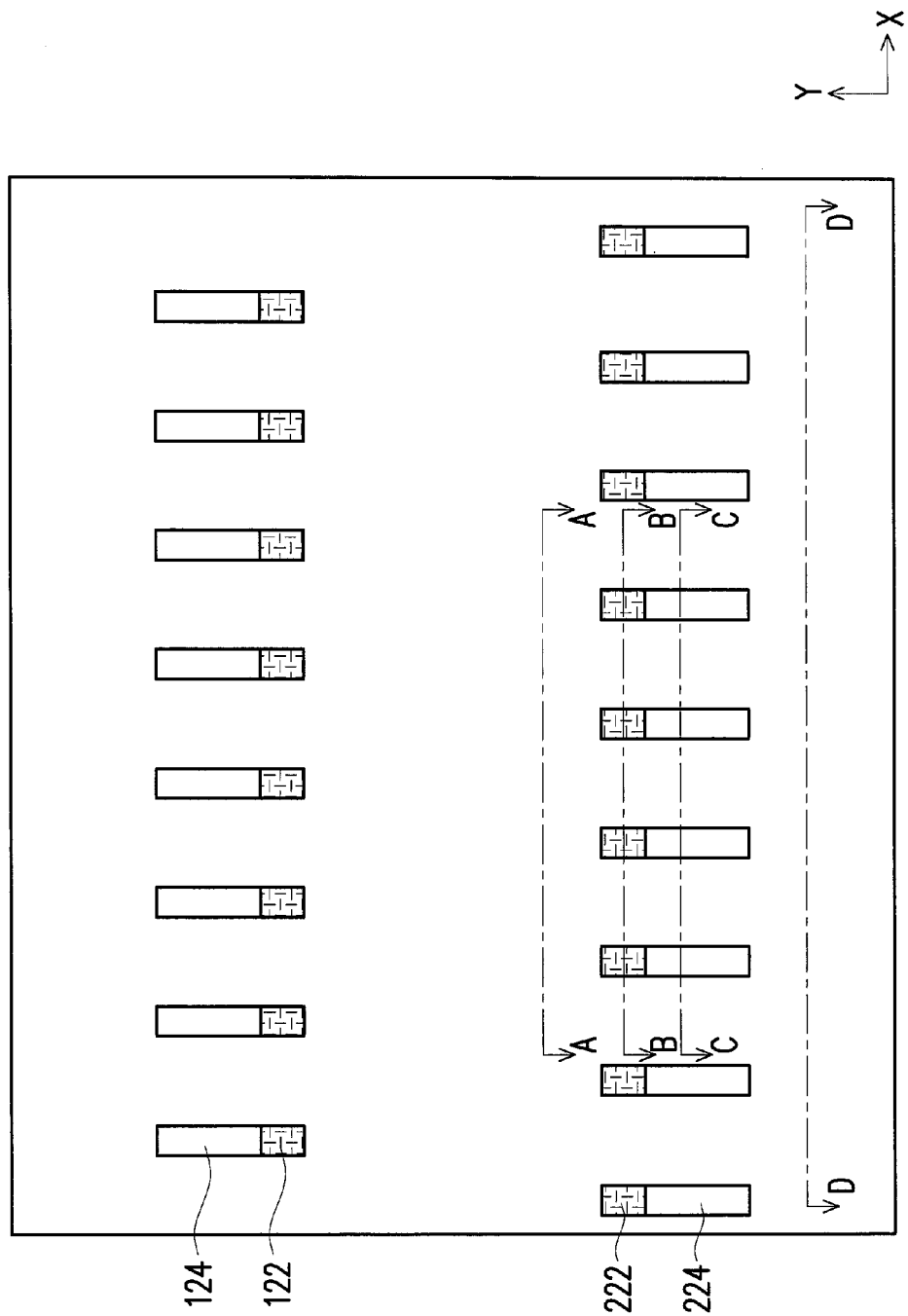

THREE-DIMENSIONAL MEMORY AND METHOD OF FORMING THE SAME

BACKGROUND OF THE INVENTION

1. Field of Invention

The present invention relates to a semiconductor device and a method of forming the same, and more particularly to a three-dimensional memory and a method of forming the same.

2. Description of Related Art

As the demand for storage subsystems of consumer products is increased, the standard for the reading/writing speeds or capacities of products is higher, and thus, high-capacity related products have become the mainstream in the industry. Accordingly, the development of memory, especially NAND flash memory, has to respond to this demand.

However, the existing planar NAND flash memory is limited by the device critical dimension in integrated circuits, so that the miniaturization of storage memory cells faces a bottleneck. Therefore, in order to achieve a greater storage capacity and a lower cost per bit, designers seek for a three-dimensional NAND flash memory with multiple planes.

SUMMARY OF THE INVENTION

The present invention provides a three-dimensional memory and a method of forming the same, in which the uniformity and reliability of the device are improved.

The present invention provides a three-dimensional memory and a method of forming the same, in which a low resistance path is generated to increase the turn-on current.

The present invention provides a three-dimensional memory and a method of forming the same, in which the turn-on resistance is reduced and the turn-on current is increased.

The present invention provides a method of forming a three-dimensional memory. A stacked structure is formed on a substrate, wherein the stacked structure includes a plurality of semiconductor layers and a plurality of insulating layers arranged alternately. The stacked structure is patterned to form a first comb structure and to form a plurality of trenches in the substrate, wherein the first comb structure includes a bit line pad extending along a first direction and a plurality of comb-teeth portions extending along a second direction different from the first direction, and a first end of each comb-teeth portion is connected to the bit line pad. A charge storage layer is formed on a top surface and a sidewall of the first comb structure. A plurality of bit lines and two first auxiliary gates are formed on the charge storage layer, wherein each word line extends along the first direction and covers the top surface and the sidewall of a portion of the comb-teeth portions in a first area, and the first auxiliary gates extend in the first direction and respectively cover the top surface and the sidewall of two edge regions of the bit line pad. The charge storage layer on the top surface of the bit line pad is removed, and the stacked structure of the bit line pad is patterned to form a stepped structure. An ion implantation process is performed to the stepped structure, so as to form a doped region in the semiconductor layer below each step surface of the stepped structure. A plurality of contacts respectively contact the doped regions.

The present invention further provides a method of forming a three-dimensional memory. A stacked structure is formed on a substrate, wherein the stacked structure includes a plurality of semiconductor layers and a plurality of insulating layers arranged alternately. The stacked structure is patterned to form a first comb structure and to form a plurality of trenches in the substrate, wherein the first comb structure includes a bit line pad extending along a first direction and a plurality of comb-teeth portions extending along a second direction different from the first direction, and a first end of each comb-teeth portion is connected to the bit line pad. A charge storage layer is formed on a top surface and a sidewall of the first comb structure. A plurality of word lines and a plurality of separate island gates are formed on the charge storage layer, wherein each word line extends along the first direction and covers the top surface and the sidewall of a portion of the comb-teeth portions in a first area, and the island gates are arranged in the first direction and cover the charge storage layer on the top surface and the sidewall of the comb-teeth portions in a second area.

The present invention also provides a three-dimensional memory including a substrate, stacked structures, doped regions, a charge storage layer, word lines, first auxiliary gates and contacts. The substrate has a plurality of trenches therein. The stacked structures are disposed on the substrate between the trenches, wherein each stacked structure includes a plurality of semiconductor layers and a plurality of insulating layers arranged alternately, and the stacked structures and the substrate constitute a first comb structure. The first comb structure include: a bit line pad, extending along a first direction, wherein the stacked structure of the bit line pad exhibits a stepped structure; and a plurality of comb-teeth portions, extending in a second direction different from the first direction, wherein a first end of each comb-teeth portion is connected to the bit line pad. The doped regions are respectively disposed in the semiconductor layers below step surfaces of the stepped structure. A charge storage layer covers a top surface and a sidewall on the first comb structure. The word lines extend along the first direction, wherein each word line covers the charge storage layer on the top surface and the sidewall of a portion of the comb-teeth portions in a first area. Two first auxiliary gates extend in the first direction and respectively cover the charge storage layer on the top surface and the sidewall of two edge regions of the bit line pad. The contacts respectively contact the doped regions.

The present invention further provides a three-dimensional memory including a substrate, stacked structures, doped regions, a charge storage layer, word lines and island gates. The substrate has a plurality of trenches therein. The stacked structures are disposed on the substrate between the trenches, wherein each stacked structure includes a plurality of semiconductor layers and a plurality of insulating layers arranged alternately, and the stacked structures and the substrate constitute a first comb structure. The first comb structure include: a bit line pad, extending along a first direction, wherein the stacked structure of the bit line pad exhibits a stepped structure; and a plurality of comb-teeth portions, extending in a second direction different from the first direction, wherein a first end of each comb-teeth portion is connected to the bit line pad. The doped regions are respectively disposed in the semiconductor layers below step surfaces of the stepped structure. A charge storage layer covers a top surface and a sidewall on the first comb structure. The word lines extend along the first direction, wherein each word line covers the charge storage layer on the top surface and the sidewall of a portion of the comb-teeth portions in a first area. The separate island gates are arranged in the first direction and cover the charge storage layer on top surface and the sidewall of the comb-teeth portions in a second area between the bit line pad and the word lines.

In view the above, in the three-dimensional memory of the invention, each bit line pad has a stepped structure and a doped region is formed at the surface of the corresponding semiconductor layer below each step surface. The doped regions are formed with an ion implantation process after the formation of the stepped structure and before the formation of the dielectric layer, and the insulating layers on the semiconductor layers of the stepped structure have substantially the same thickness, and thus, the doped regions have substantially the same junction depth and concentration. Accordingly, the uniformity and reliability of the device can be improved.

Besides, in the invention, the first auxiliary gates are formed to cover the top surface and the sidewall of edge regions of the bit line pad. When a voltage is applied to the first auxiliary gates, a channel is formed in the semiconductor layers and a low-resistance path is therefore generated.

In addition, the island gates and the second auxiliary gates are further disposed on the charge storage layer between the ground select lines GSL1/GSL2 and the bit line pad. Two second auxiliary gates are disposed beside each comb-teeth portion and electrically connected to one island gate. When a voltage is applied to the island gates, a depletion region can be generated in the semiconductor layers of the stack structures of the comb-teeth portions covered by the island gates and the second auxiliary gates, so as to reduce the turn-on resistance and increase the turn-on current.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 to FIG. 8 are top views illustrating a method of forming a three-dimensional memory according to an embodiment of the present invention.

FIG. 1A to FIG. 8A are cross-sectional views taken along the line A-A of FIG. 1 to FIG. 8.

FIG. 1B to FIG. 8B are cross-sectional views taken along the line B-B of FIG. 1 to FIG. 8.

FIG. 1C to FIG. 8C are cross-sectional views taken along the line C-C of FIG. 1 to FIG. 8.

FIG. 1D to FIG. 8D are cross-sectional views taken along the line D-D of FIG. 1 to FIG. 8.

DESCRIPTION OF EMBODIMENTS

Figure 1A:
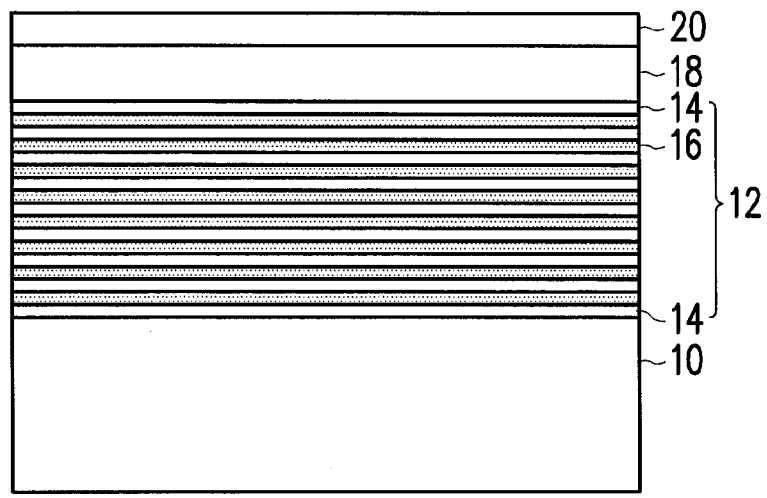
Figure 1B:
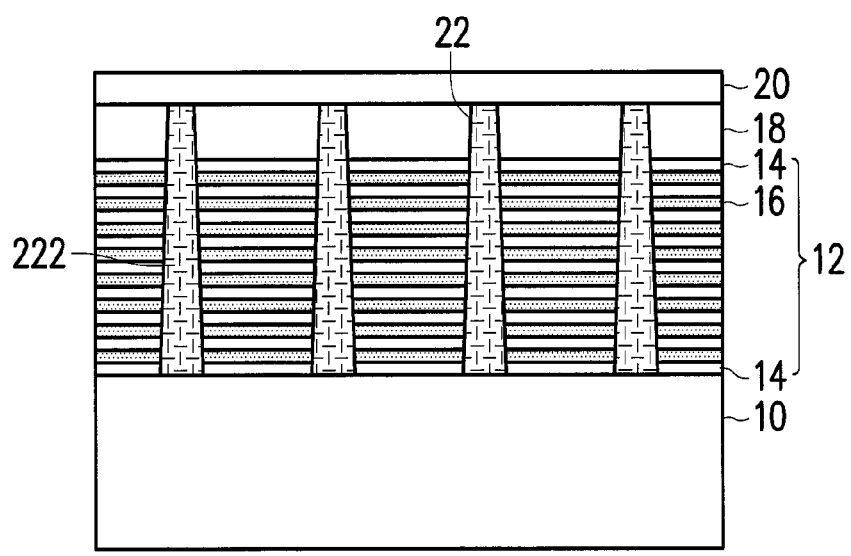
Figure 1C:
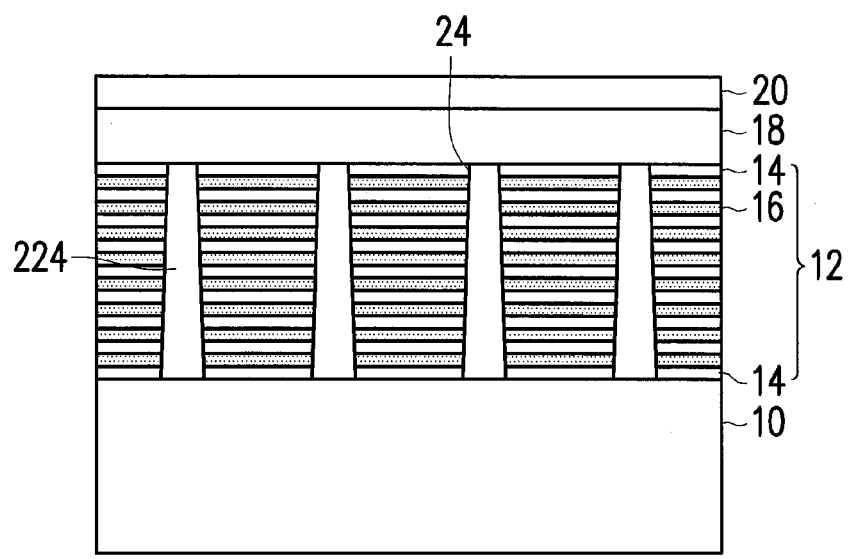

Reference will now be made in detail to the present preferred embodiments of the invention, examples of which are illustrated in the accompanying drawings. Wherever possible, the same reference numbers are used in the drawings and the description to refer to the same or like parts.

FIG. 1 to FIG. 8 are top views illustrating a method of forming a three-dimensional memory according to an embodiment of the present invention. FIG. 1A to FIG. 8A are cross-sectional views taken along the line A-A of FIG. 1 to FIG. 8. FIG. 1B to FIG. 8B are cross-sectional views taken along the line B-B of FIG. 1 to FIG. 8. FIG. 1C to FIG. 8C are cross-sectional views taken along the line C-C of FIG. 1 to FIG. 8. FIG. 1D to FIG. 8D are cross-sectional views taken along the line D-D of FIG. 1 to FIG. 8.

Figure 1D:
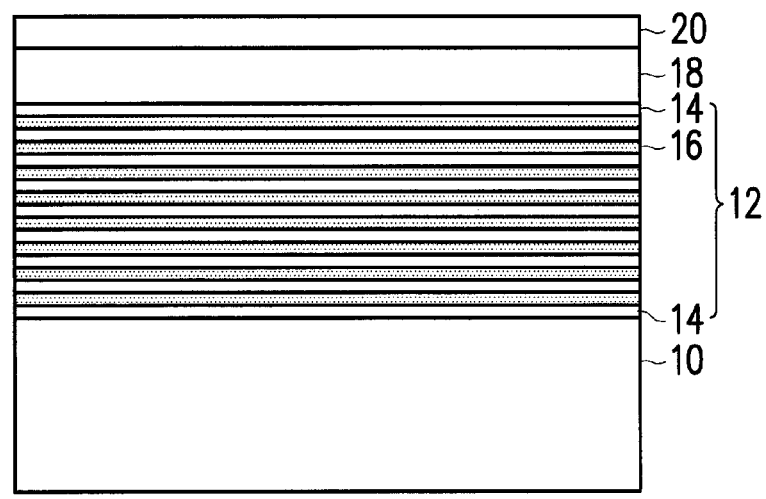

Referring to FIG. 1 to FIG. 1D, a stacked structure 12 is formed on a substrate 10. The stacked structure 12 includes a plurality of insulating layers 14 and a plurality of semiconductor layers 16 arranged alternately. The insulating layers 14 include a dielectric material, such as silicon oxide, silicon nitride, silicon oxynitride or a combination thereof. The insulating layers 14 can have the same or different thicknesses. The thickness of the insulating layers 14 can be, for example but not limited to, 200 to 500 angstroms. The semiconductor layers 16 include undoped polysilicon or doped polysilicon. The semiconductor layers 16 can have the same or different thicknesses. The thickness of the semiconductor layers 16 can be, for example but not limited to, 200 to 500 angstroms. Besides, the thicknesses and numbers of layers of the insulating layers 14 and the semiconductor layers 16 are not limited by the said descriptions and the figures, and can be adjusted upon the actual requirements and the process conditions.

Thereafter, a plurality of first contact plugs 122, a plurality of second contact plugs 222, a plurality of isolation plugs 124 and a plurality of isolation plugs 224 are formed in the stacked structure 12. The forming sequence of the first contact plugs 122, the second contact plugs 222, the isolation plugs 124 and the isolation plugs 224 are not limited by the present invention.

In an embodiment, the isolation plugs 124 and the isolation plugs 224 can be formed prior to the formation of the first contact plugs 122 and the second contact plugs 222. The method of forming the isolation plugs 124 and the isolation plugs 224 includes forming openings 24 in the stacked structure 12, forming an insulating material layer in the openings 24, and removing the insulating material layer on the surface of the stacked structure 12 with a chemical mechanical polishing process or an etching back process. The insulating material layer includes silicon oxide, silicon nitride, silicon oxynitride or a combination thereof. Thereafter, a cap layer 18 is formed on the surface of the stacked structure 12 and on the surfaces of the first and second isolation plugs 124 and 224. The cap layer 18 includes a dielectric material, such as silicon oxide, silicon nitride, silicon oxynitride or a combination thereof. The material of the cap layer 18 can be different from that of each insulating layer 14. The thickness of the cap layer 18 can be greater than that of each insulating layer 14. The method of forming the first contact plugs 122 and the second contact plugs 222 includes forming contact holes 22 in the cap layer 18 and in the stacked structure 12, forming a conductive material layer in the contact holes 22, and removing the conductive material layer on the cap layer 18 with a chemical mechanical polishing process or an etching back process. The conductive material layer includes doped polysilicon or undoped polysilicon. Afterwards, a cap layer 20 is formed on the surface of the cap layer 18 and on the surfaces of the first and second contact plugs 122 and 222. The cap layer 20 includes a dielectric material, such as silicon oxide, silicon nitride, silicon oxynitride or a combination thereof. The material of the cap layer 20 can be the same or different from that of the cap layer 18.

In another embodiment, the isolation plugs 124 and the isolation plugs 224 can be formed after the formation of the first contact plugs 122 and the second contact plugs 222. For clarity of illustration, the cap layers 18 and 20 are not shown in the top views of FIG. 1 to FIG. 8.

Figure 2:
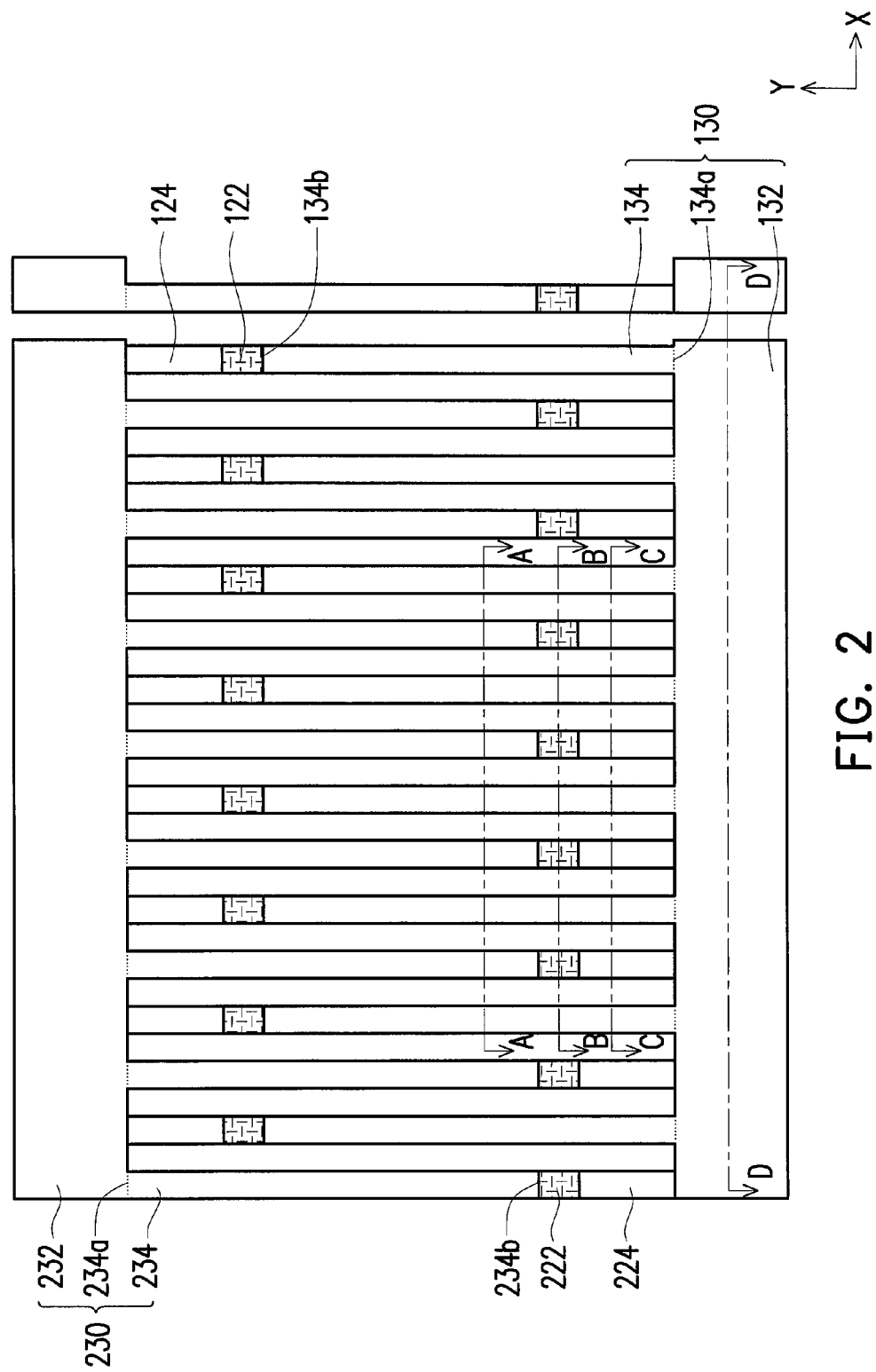
Figure 2A:
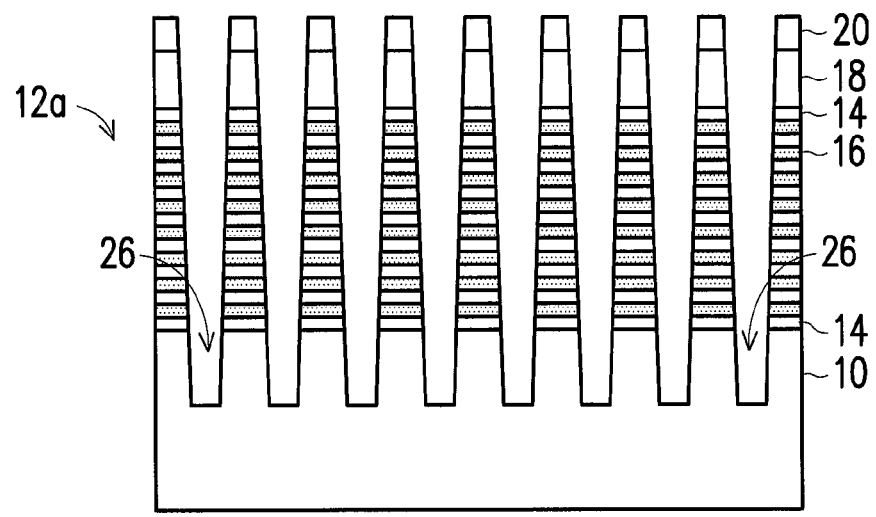
Figure 2B:
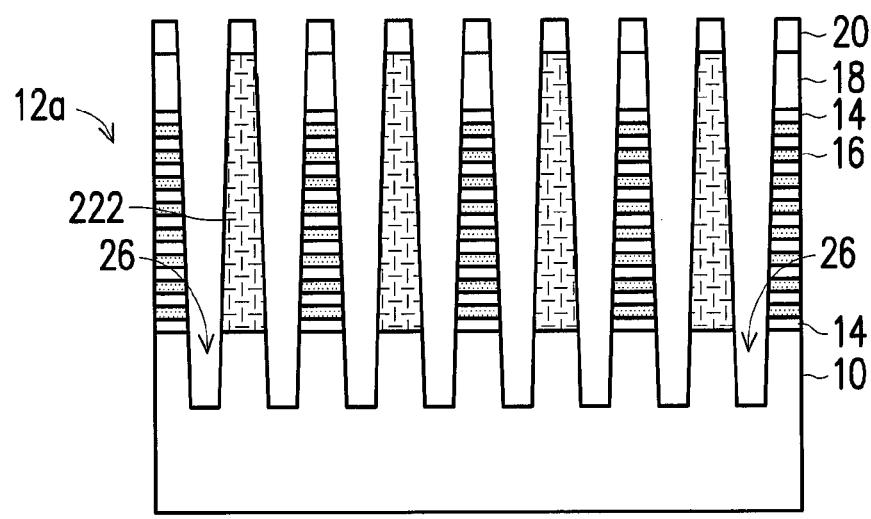
Figure 2C:
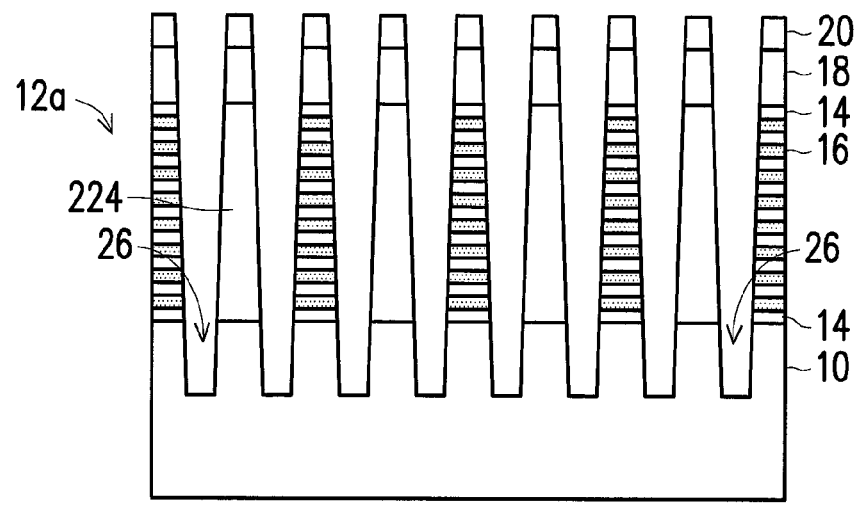
Figure 2D:
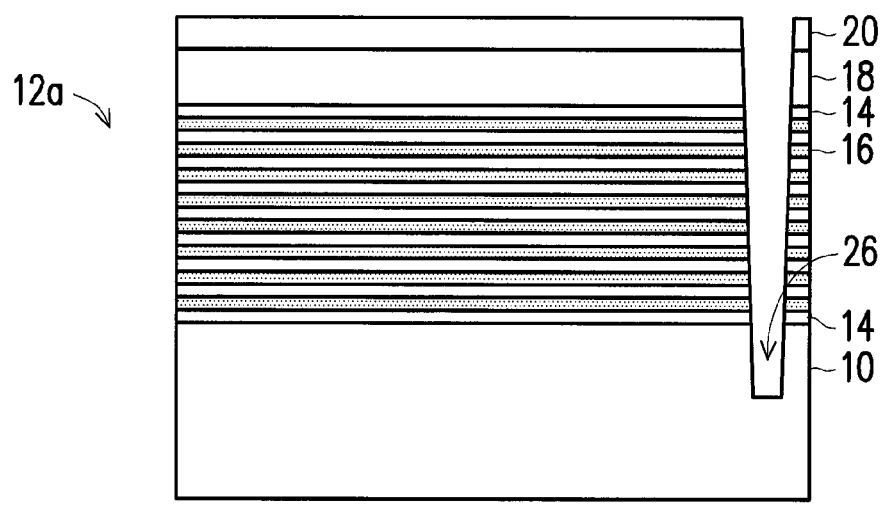

Referring to FIG. 2 to FIG. 2D, the stacked structure 12 and the cap layers 18 and 20 are patterned to form a plurality of patterned stack structures 12a, to form a first comb structure 130 and a second comb structure 230, and to form a plurality of trenches 26 in the substrate 10. The first comb structure 130 includes bit line pad 132 extending along a first direction and a plurality of comb-teeth portions 134 extending along a second direction different from the first direction. In an embodiment, the first direction is X-direction, and the second direction is Y-direction. The first end 134a of each comb-teeth portion 134 is connected to the bit line pad 132. The second end 134b of each comb-teeth portion 134 is connected to corresponding first contact plug 122, so that the semiconductor layers 16 of the comb-teeth portion 134 of the first comb structure 130 are electrically connected to the substrate 10 through the corresponding first contact plug 122. Specifically, the semiconductor layers 16 of each comb-teeth portion 134 of the first comb structure 130 are vertically connected to the substrate 10 through the corresponding first contact plug 122. Each first contact plug 122 can be referred to as a first source contact plug.

Similarly, the second comb structure 230 includes a bit line pad 232 and a plurality of comb-teeth portions 234. The bit line pad 232 of the second comb structure extends along the first direction and corresponds to the bit line pad 132 of the first comb structure 130. The comb-teeth portions 234 of the second comb structure 230 extend along the second direction. Besides, the comb-teeth portions 234 of the second comb structure 230 and the comb-teeth portions 134 of the first comb structure 130 are arranged alternately. The first end 234a of each comb-teeth portion 234 is connected to the bit line pad 232. The second end 234b of each comb-teeth portion 234 is connected to corresponding second contact plug 222, so that the semiconductor layers 16 of the comb-teeth portion 234 of the second comb structure 230 are electrically connected to the substrate 10 through the corresponding second contact plug 222. Specifically, the semiconductor layers 16 of each comb-teeth portion 234 of the second comb structure 230 are vertically connected to the substrate 10 through the corresponding second contact plug 222. Each second contact plug 122 can be referred to as a second source contact plug.

In addition, a first isolation plug 124 disposed between each first contact plug 124 and the bit line pad 232 of the second comb structure 230 for electrically isolating the first contact plug 124 from the bit line pad 232 of the second comb structure 230. A second isolation plug 224 between each second contact plug 222 and the bit line pad 132 of the first comb structure 130.

Figure 3:
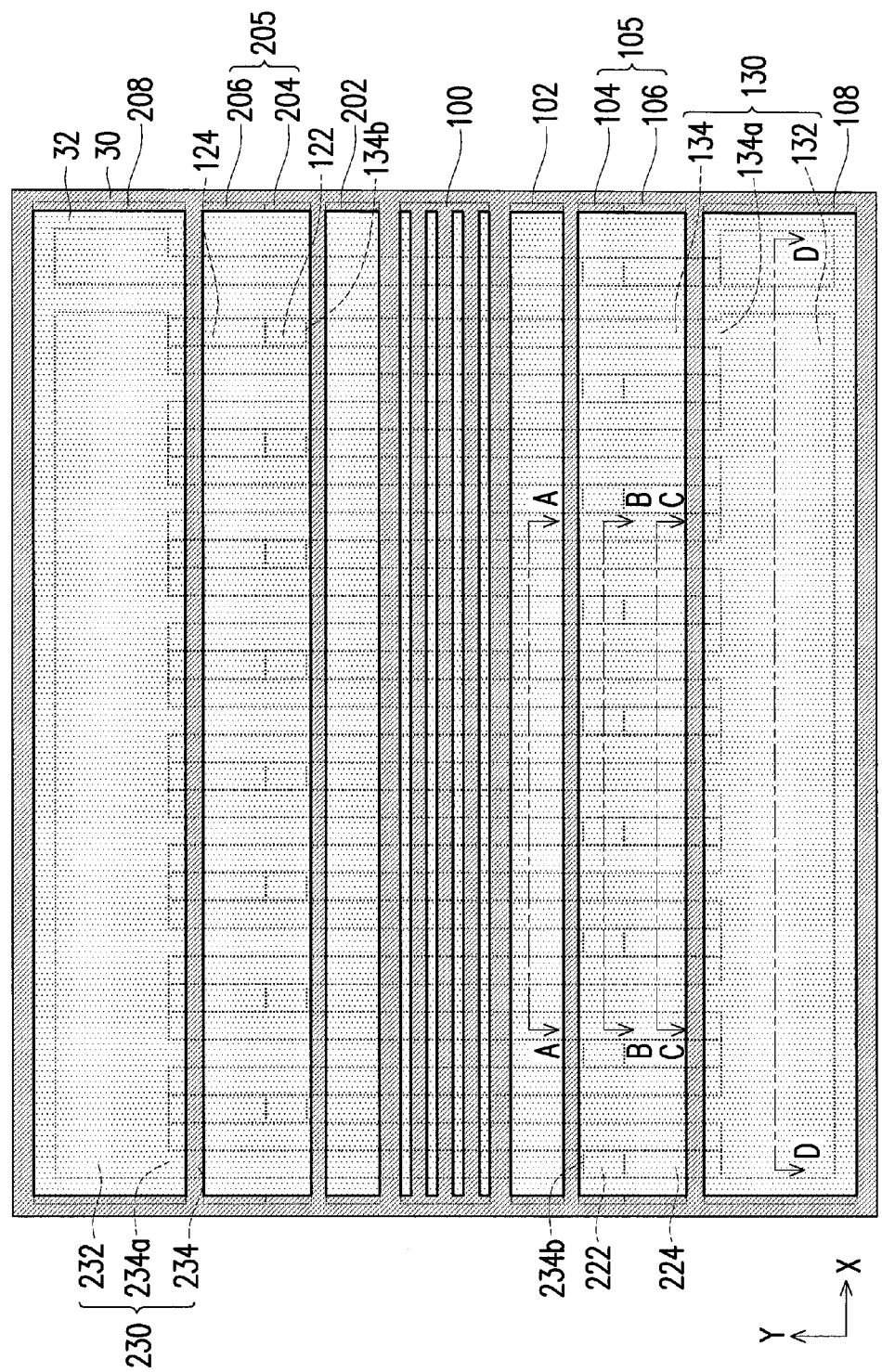
Figure 3A:
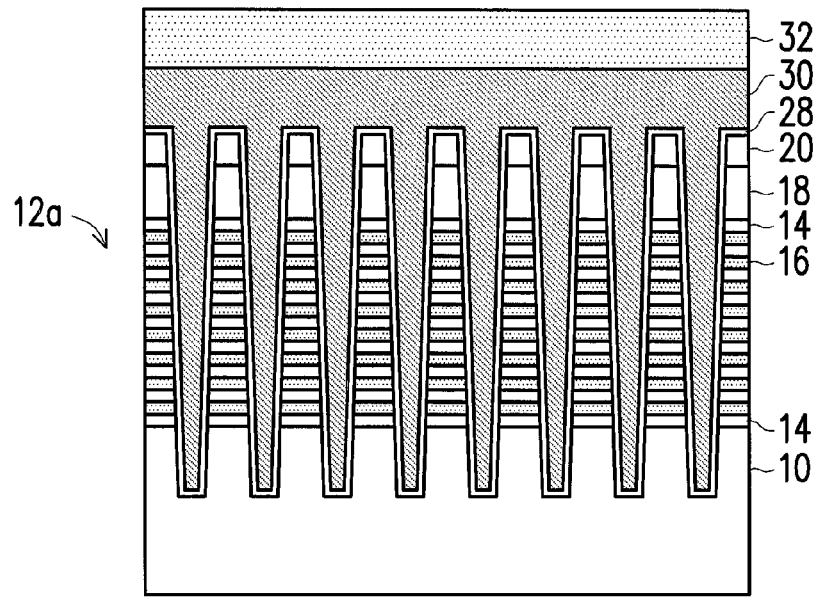
Figure 3B:
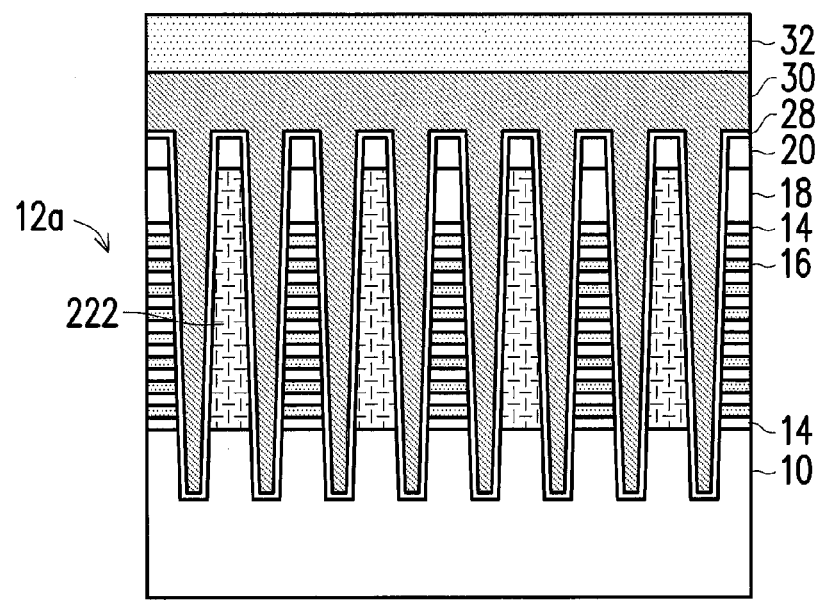
Figure 3C:
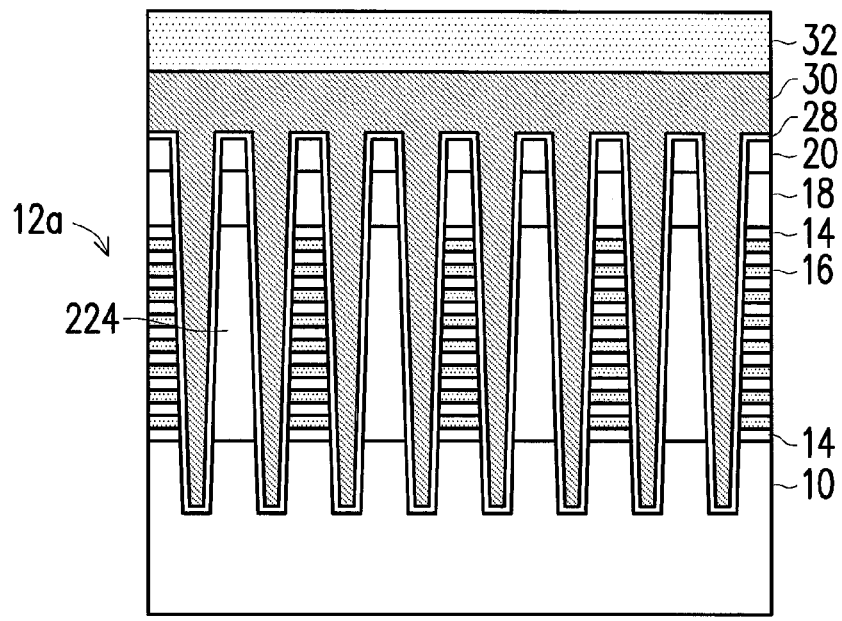
Figure 3D:
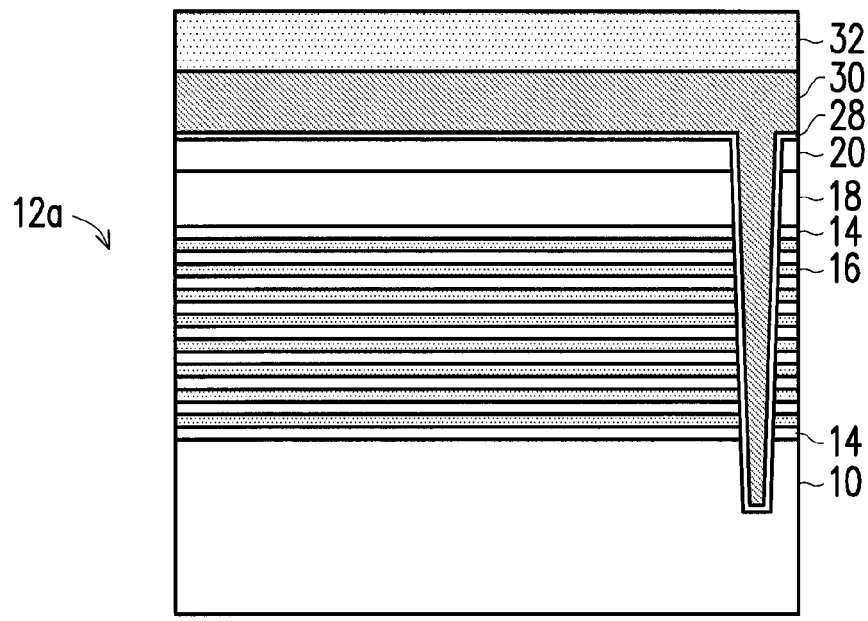

Referring to FIG. 3 to FIG. 3D, a charge storage layer 28 is formed on top surfaces and sidewalls of the first and second comb structures 130 and 230. The charge storage layer 28 can be a single-layer material layer or a multi-layer material layer. The charge storage layer 28 includes silicon nitride. In an embodiment, the charge storage layer 28 is a stacked structure including a silicon oxide layer, a silicon nitride layer and another silicon oxide layer. A conductive layer 30 is formed on the charge storage layer 28. The conductive layer 30 includes undoped polysilicon or doped polysilicon. The method of forming each of the charge storage layer 28 and the conductive layer 30 includes performing a chemical vapour deposition (CVD) process.

Thereafter, a patterned photoresist layer 32 is formed on the conductive layer 30. The patterned photoresist layer 32 covers a memory cell array area 100 and areas 102, 202, 105, 205, 108 and 208. The areas 102 and 202 are located beside the memory cell array area 100. The areas 108 covers an area corresponding to the bit line pad 138 and a region around the bit line pad 138. Similarly, the areas 208 covers an area corresponding to the bit line pad 238 and a region around the bit line pad 238. The area 105 is located between the area 108 and the area 102. The area 105 includes an area 104 adjacent to the area 102 and an area 106 adjacent to the area 108. The area 205 is located between the area 208 and the area 202. The area 205 includes an area 204 adjacent to the area 202 and an area 206 adjacent to the area 208.

Figure 4:
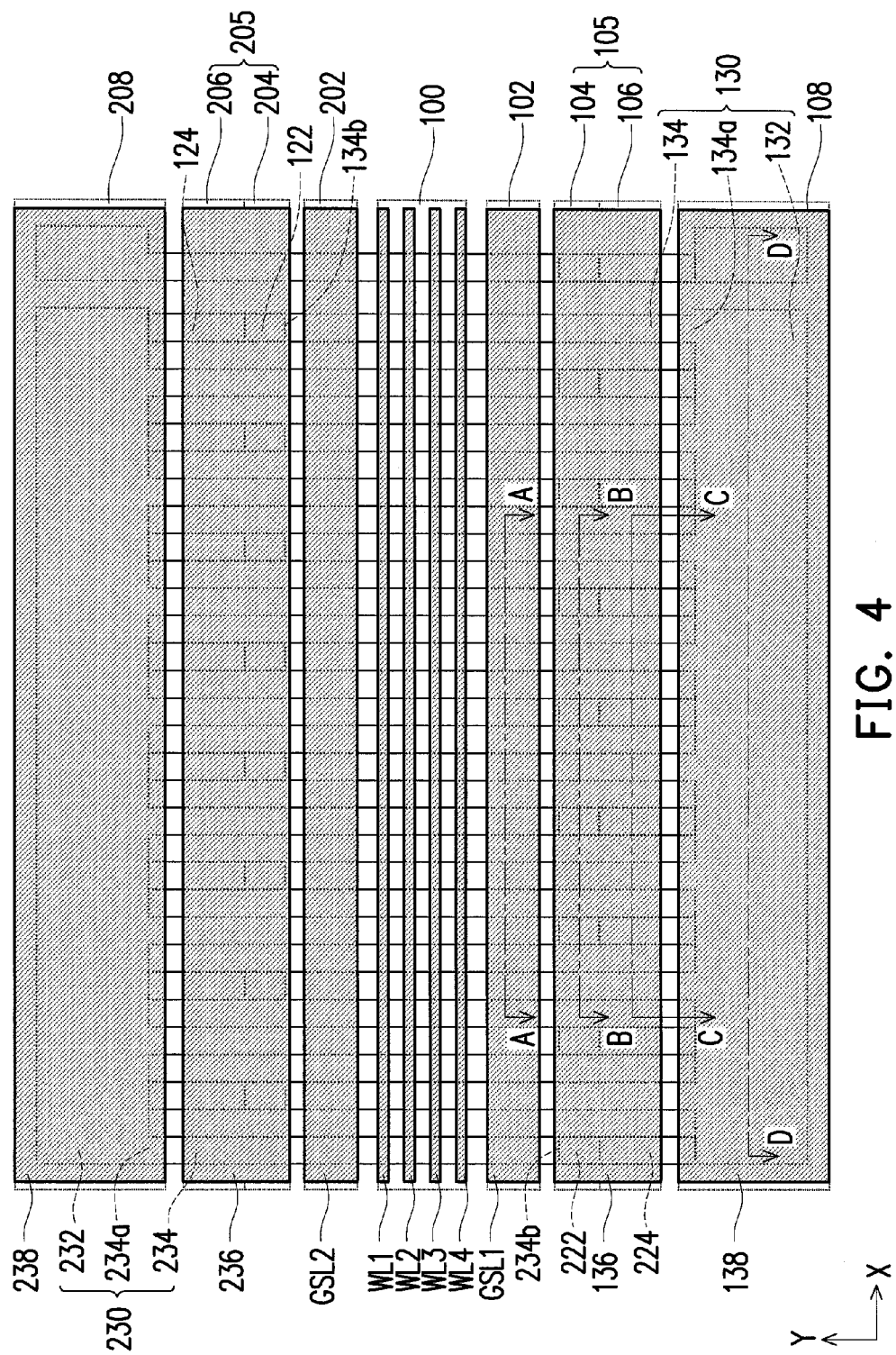
Figure 4A:
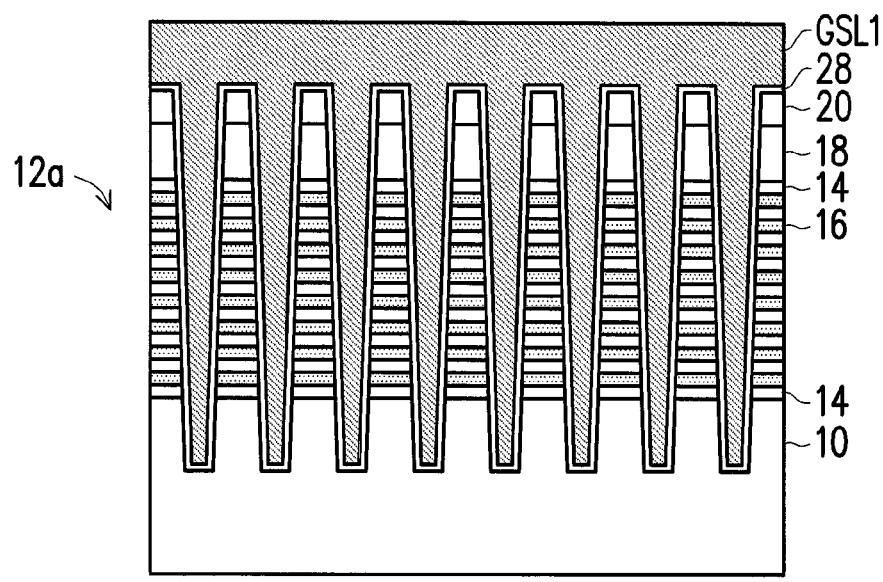
Figure 4B:
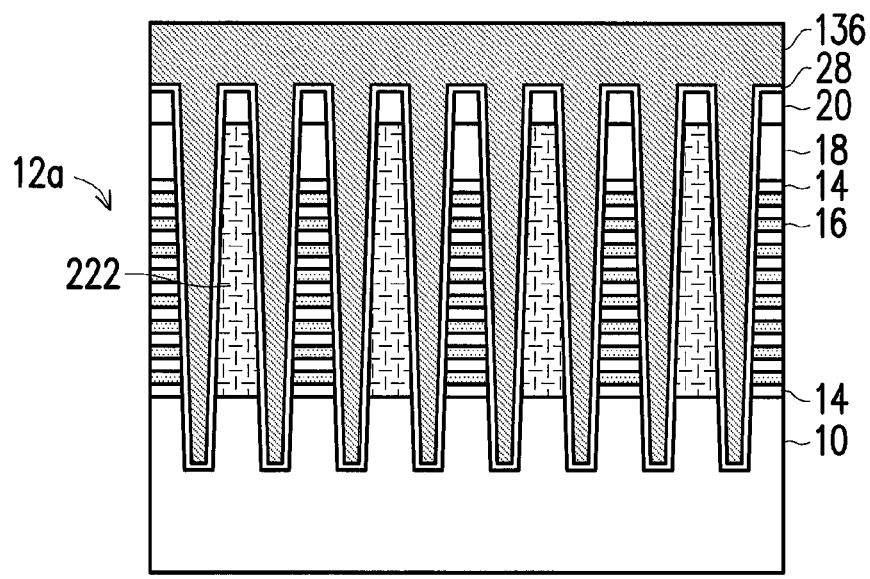
Figure 4C:
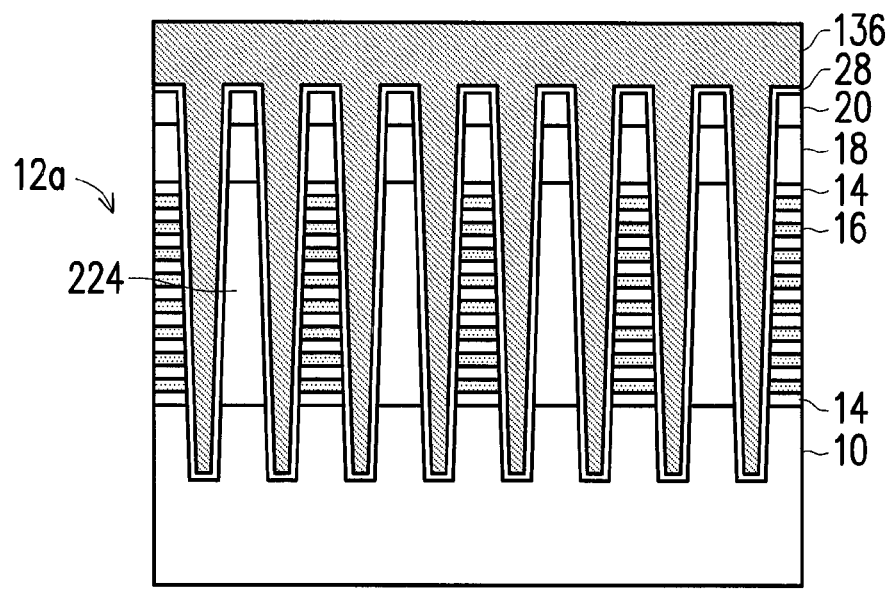
Figure 4D:
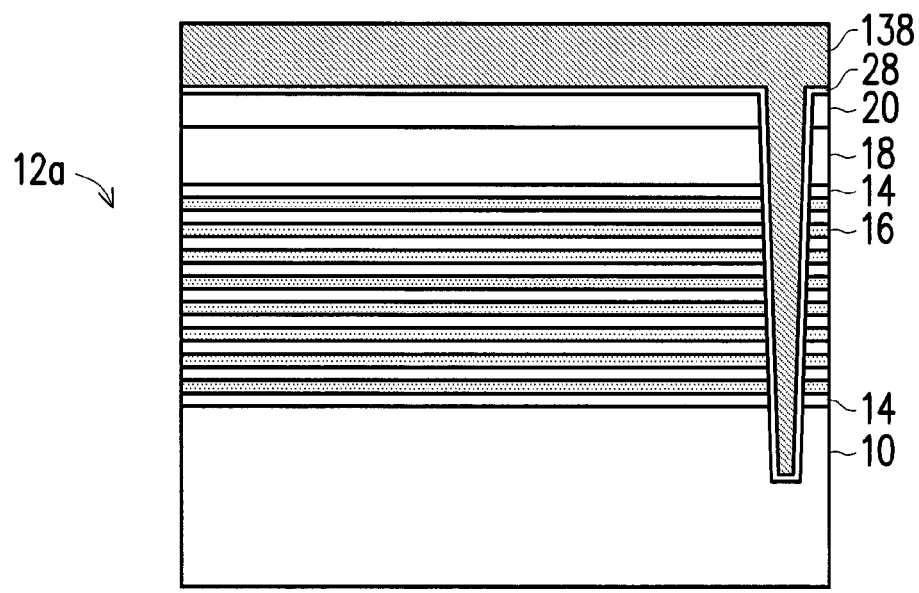

Referring to FIG. 4 to FIG. 4D, an etching process is preformed to pattern the conductive layer 30, by using the patterned photoresist layer 32 as a mask, so as to form a plurality of word lines WL1, WL2, WL3 and WL4, ground select lines GSL1 and GSL2, first patterned conductive layers 136 and 236, and second patterned conductive layers 138 and 238, all of which extend along the first direction. The word lines WL1, WL2, WL3 and WL4 are located in the memory cell array area 100. Herein, four word lines WL1 to WL4 are shown in the figures, but the number of word lines is not limited by this. As shown in FIG. 4 and FIG. 4A, the ground select lines GSL1 and GSL2 are disposed respectively in the areas 102 and 202. As shown in FIG. 4, FIG. 4B and FIG. 4C, the first patterned conductive layers 136 and 236 are disposed respectively in the areas 105 and 205. As shown in FIG. 4 and FIG. 4D, the second patterned conductive layers 138 and 238 are disposed respectively in the areas 108 and 208. Thereafter, the patterned photoresist layer 32 is removed.

Figure 5:
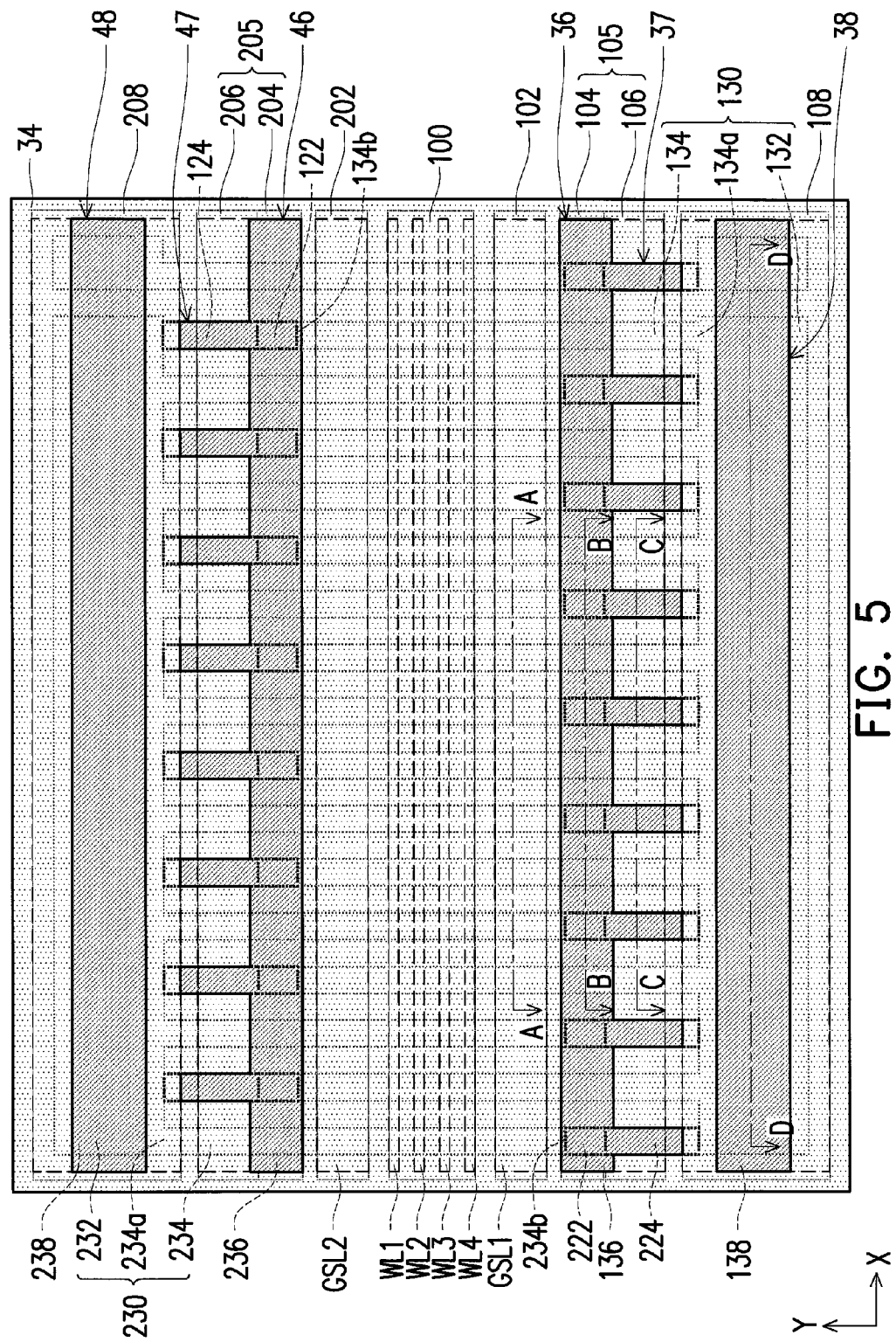
Figure 5A:
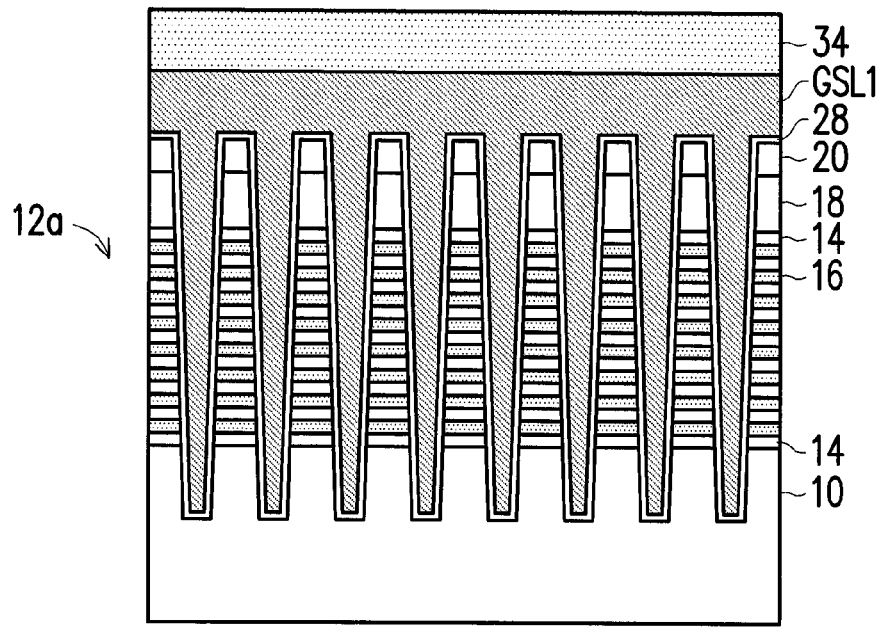
Figure 5B:
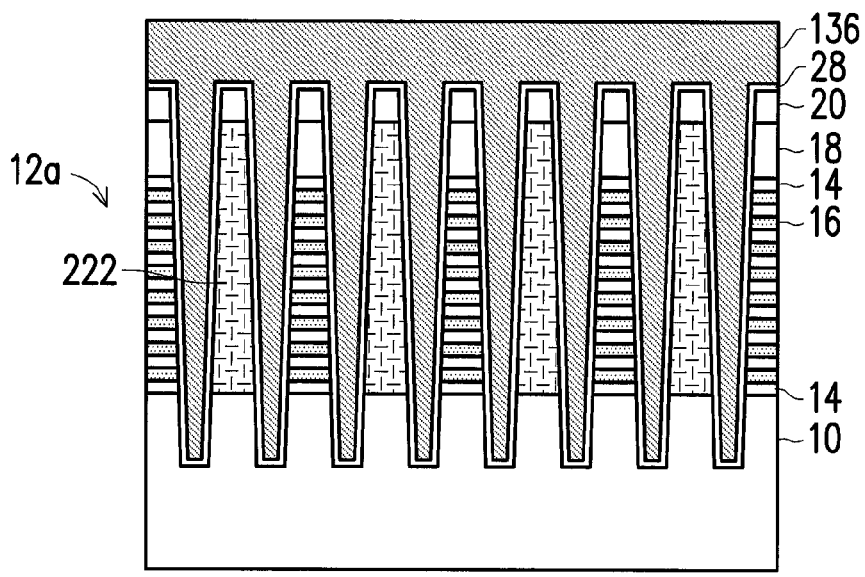
Figure 5C:
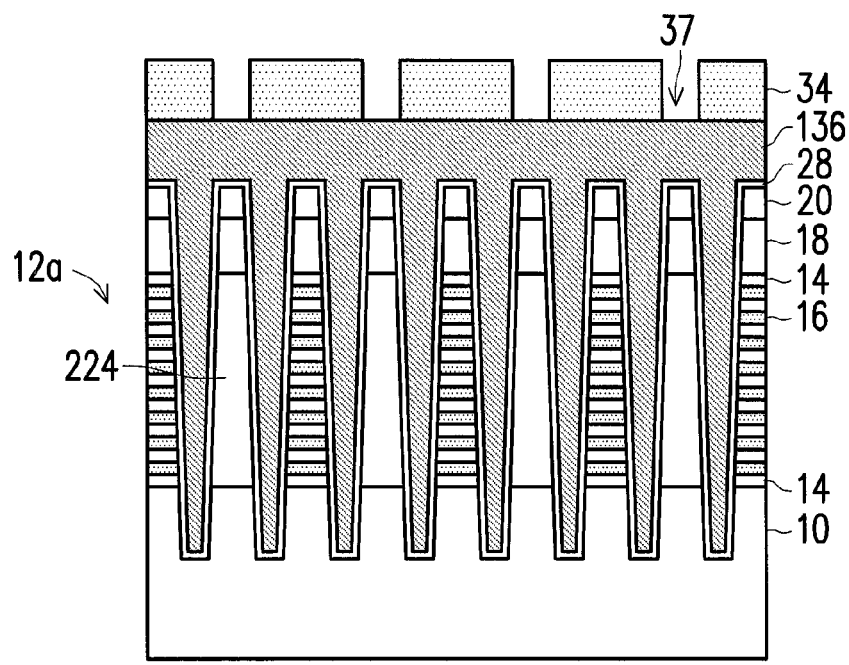
Figure 5D:
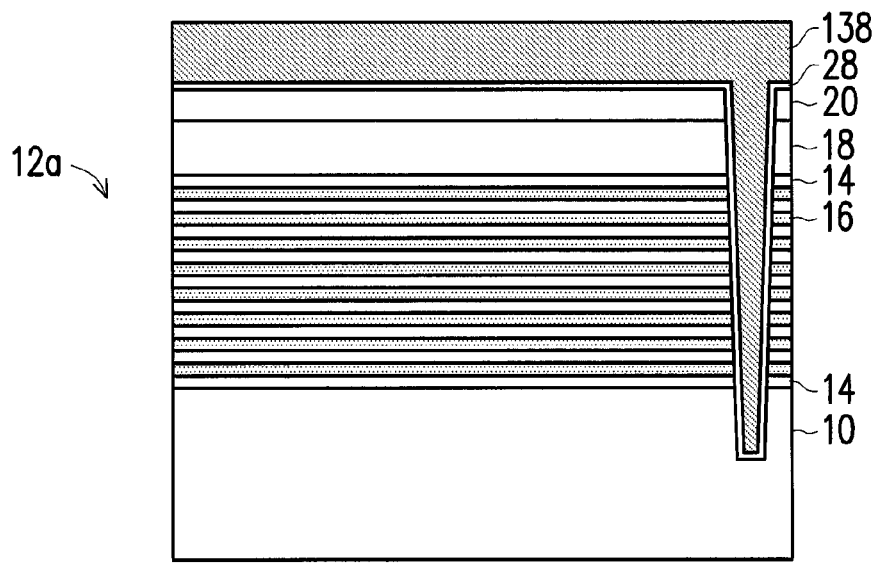

Referring to FIG. 5 to FIG. 5D, a patterned photoresist layer 34 is formed on the substrate 10. The patterned photoresist layer 34 has openings 36, 37, 38, 46, 47 and 48 therein. The opening 36 exposes the first patterned conductive layer 136 in the area 104. The openings 37 expose the first patterned conductive layer 136 on the second isolation plugs 224 in the area 105. The opening 38 exposes the second patterned conductive layer 138 in the central region of the area 108. The opening 46 exposes the first patterned conductive layer 236 in the area 204. The openings 47 expose the first patterned conductive layer 236 on the first isolation plugs 124 in the area 205. The opening 48 exposes the second patterned conductive layer 238 in the central region of the area 208.

Referring to FIG. 5 to FIG. 5D and FIG. 6 to FIG. 6D, the second patterned conductive layer 138 exposed by the opening 38 is removed by using the patterned photoresist layer 34 as a mask, so that the remaining second patterned conductive layer 138 on two edge regions of the bit line pad 132 can serve as first auxiliary gates 138a and 138b. Similarly, the second patterned conductive layer 238 exposed by the opening 48 is removed by using the patterned photoresist layer 34 as a mask, so that the remaining second patterned conductive layer 238 on two edge regions of the bit line pad 232 can serve as first auxiliary gates 238a and 238b. During the same removing step, second patterned conductive layers 138c and 138d remain in the central region of the bit line pad 132, and the first auxiliary gate 138a is electrically connected to the first auxiliary gate 138b through the patterned conductive layers 138c and 138d. Similarly, second patterned conductive layers 238c and 238d remain in the central region of the bit line pad 232, and the first auxiliary gate 238a is electrically connected to the first auxiliary gate 238b through the patterned conductive layers 238c and 238d.

Figure 6:
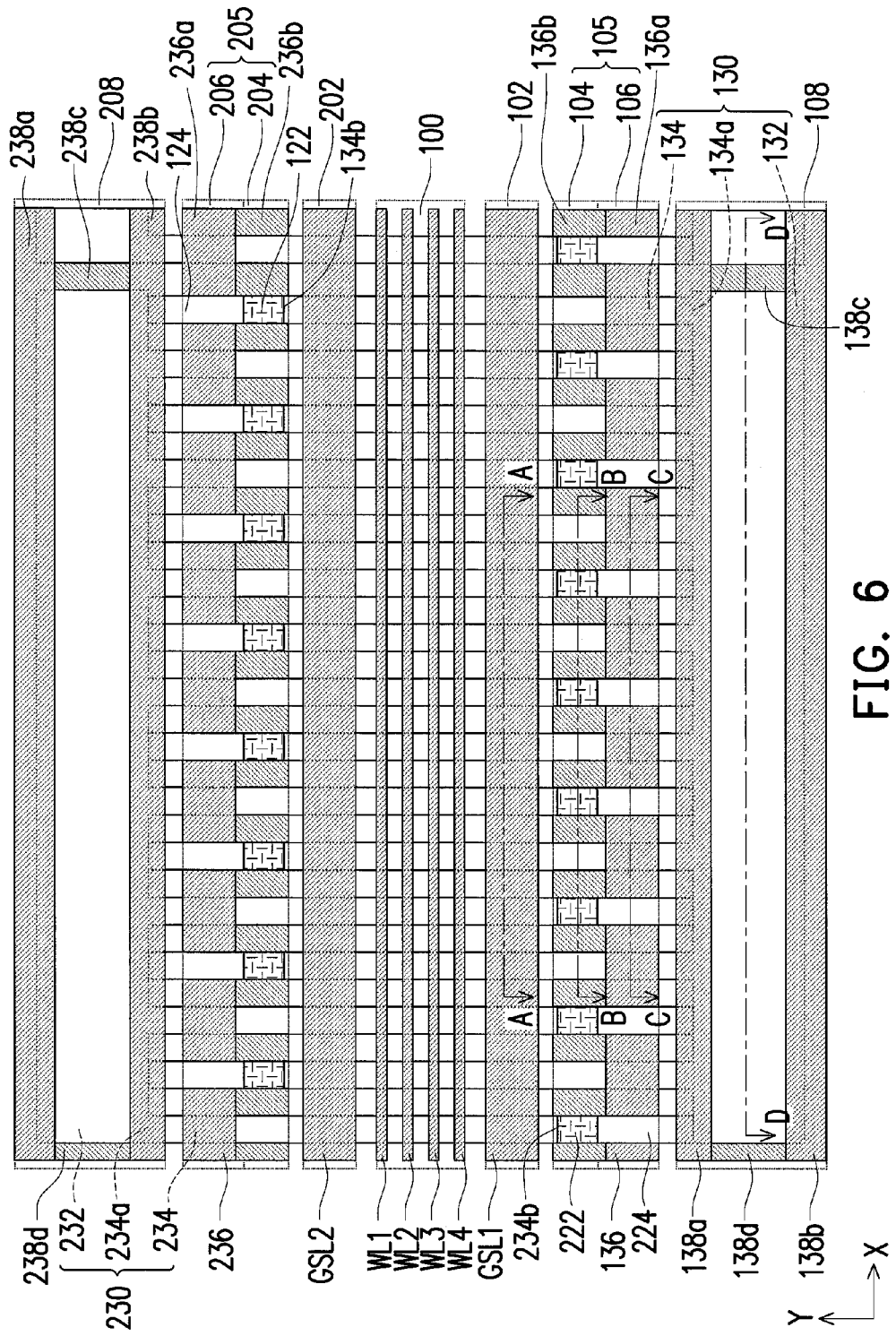
Figure 6A:
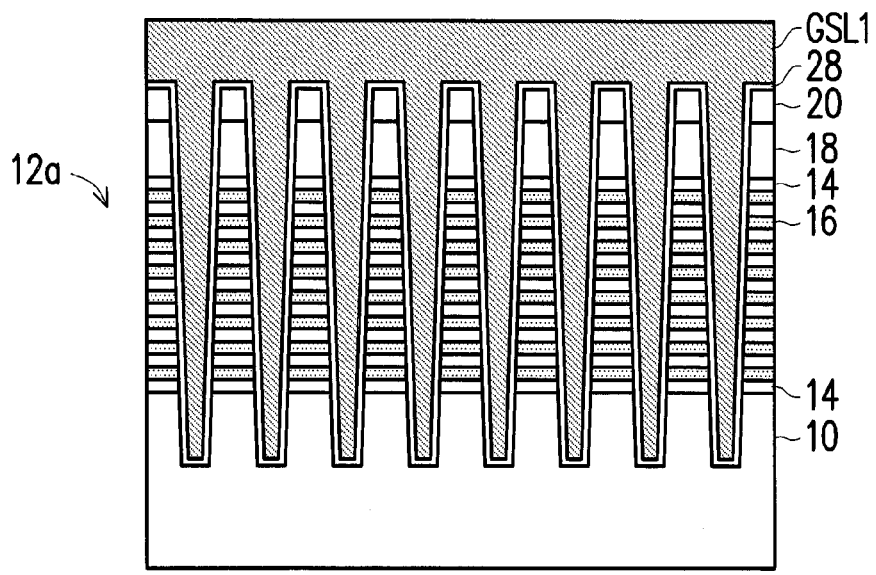
Figure 6B:
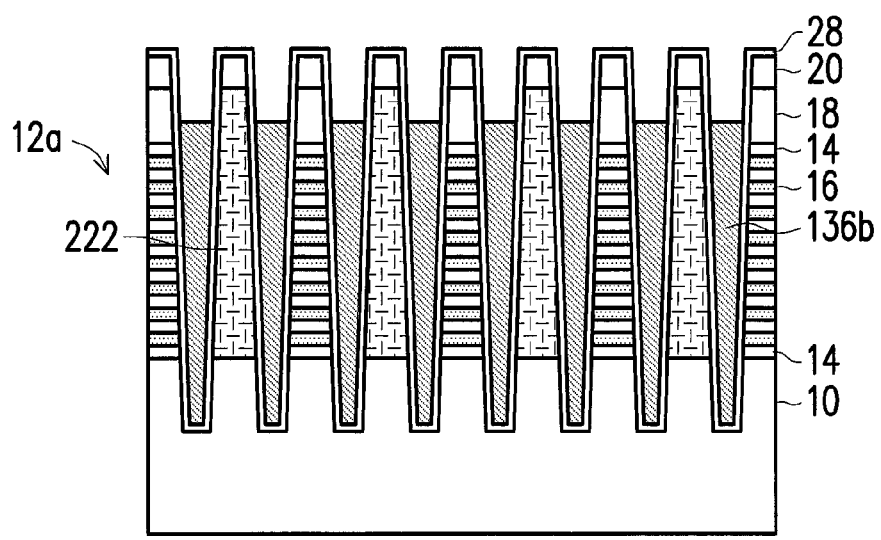
Figure 6C:
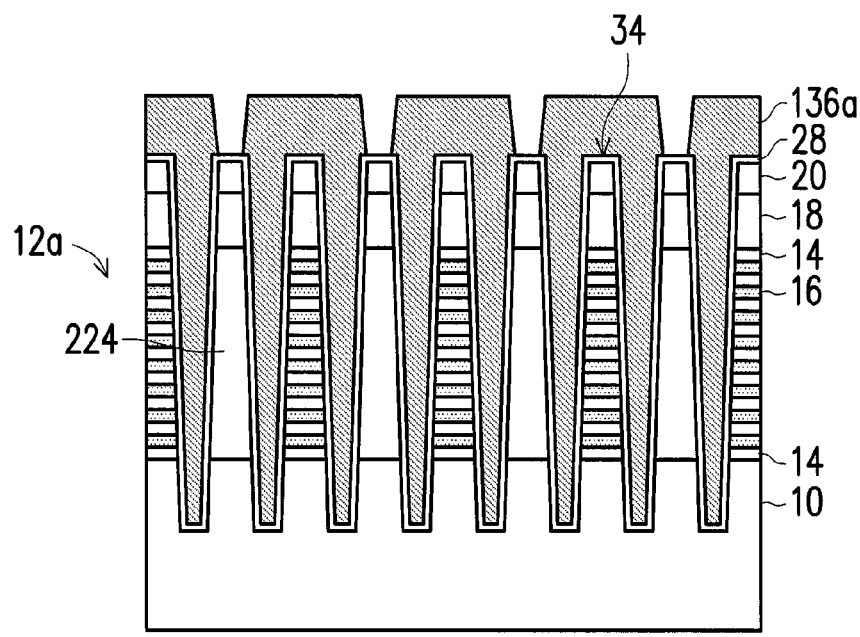
Figure 6D:
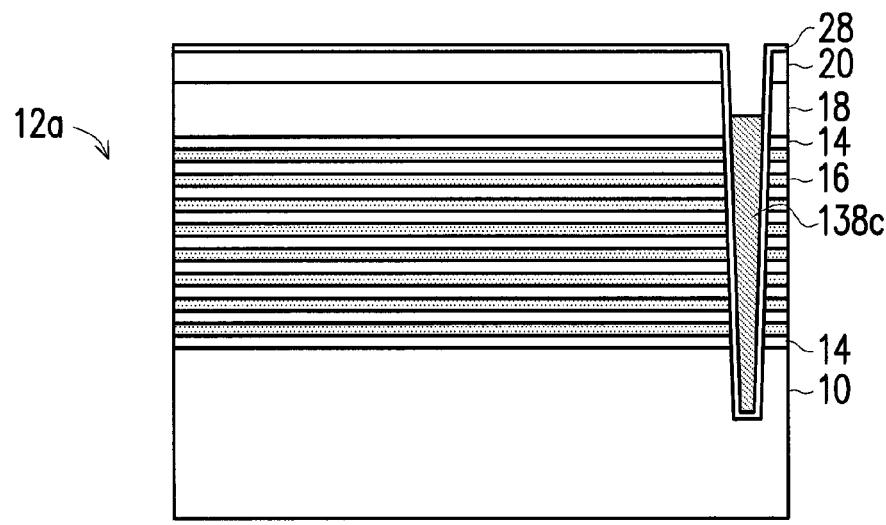
Figure 7:
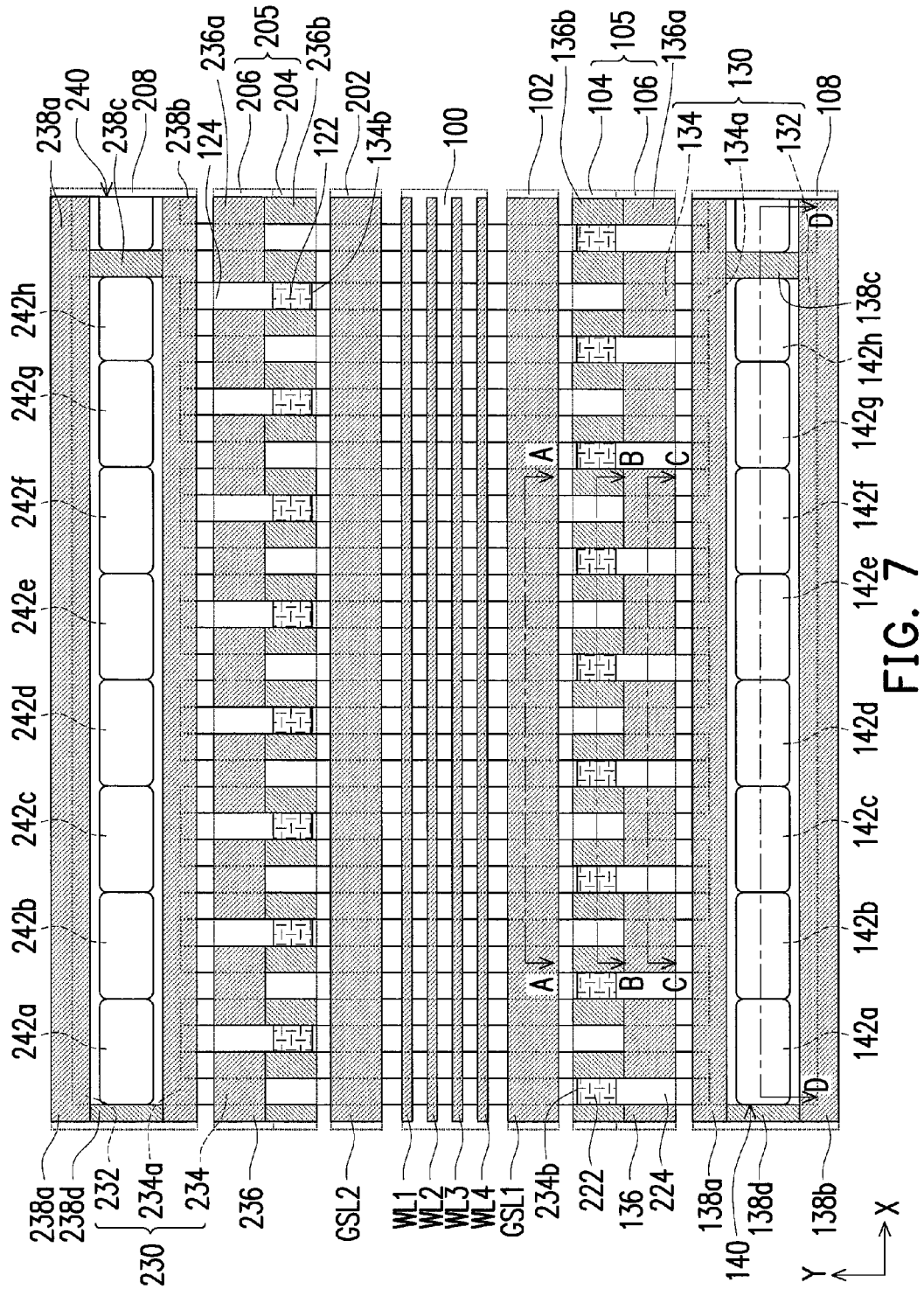
Figure 7A:
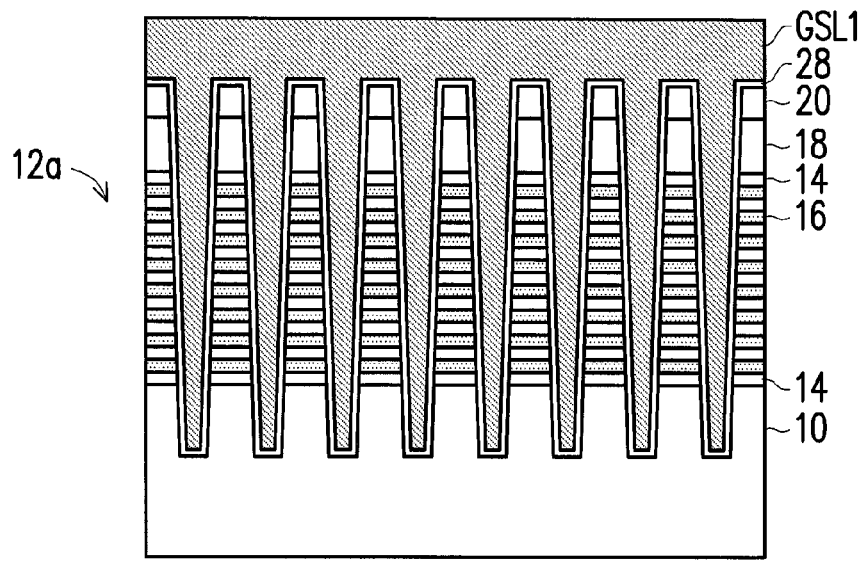
Figure 7B:
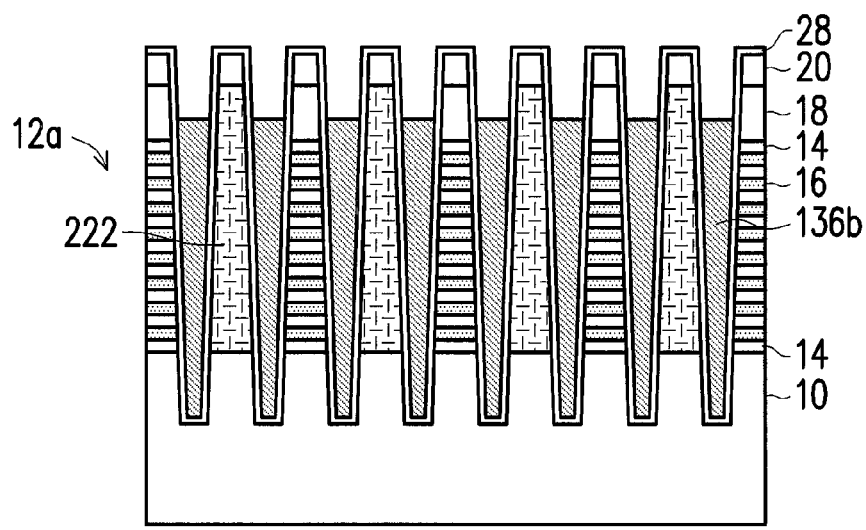
Figure 7C:
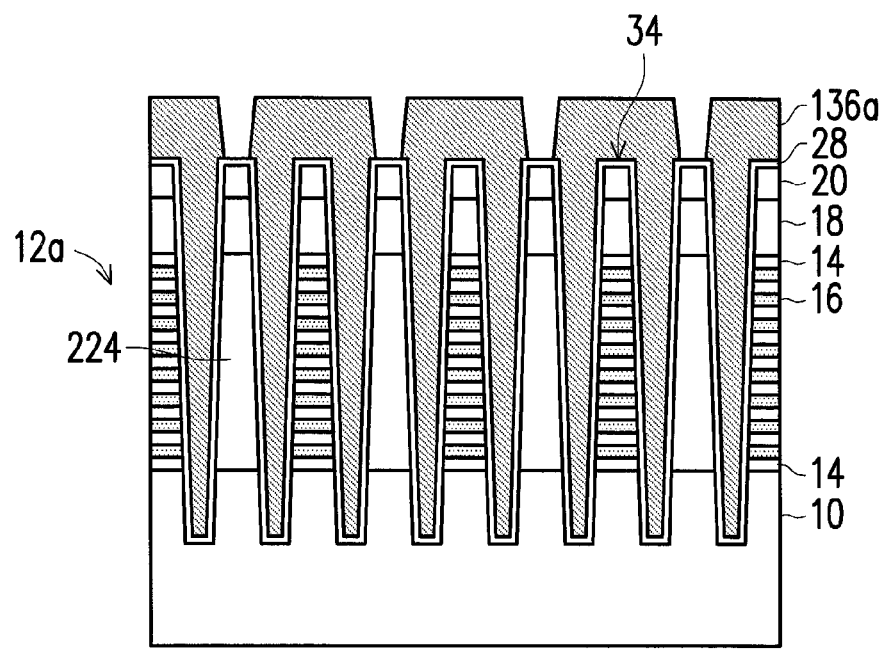
Figure 7D:
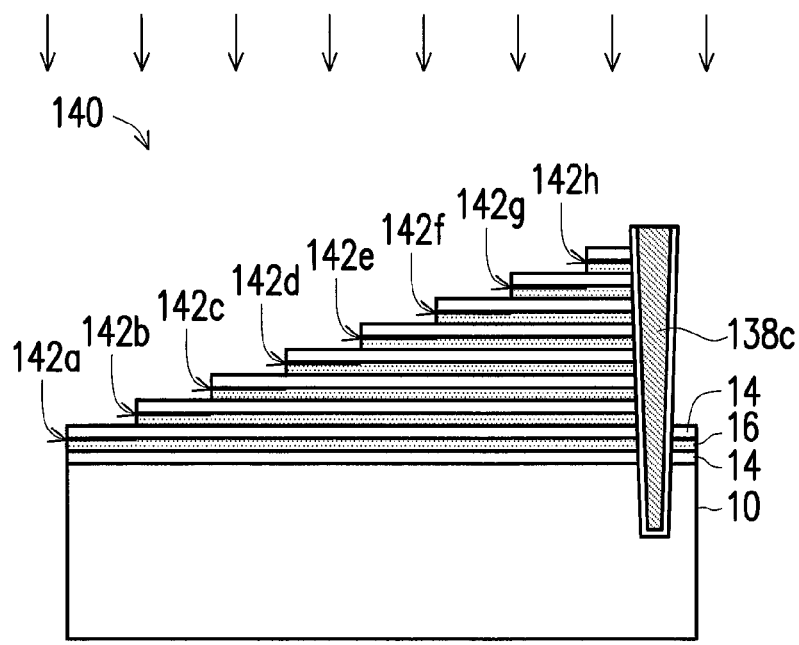

At the same time, the first patterned conductive layers 136 exposed by the openings 36 and 37 and the first patterned conductive layers 236 exposed by the openings 46 and 47 are removed by using the patterned photoresist layer 34 as a mask. Specifically, as shown in FIG. 6 and FIG. 6C, the first patterned conductive layer 136 on the second isolation plugs 224 and exposed by the openings 37 in the area 106 is completely removed, so that the remaining first patterned conductive layer 136 can serve as separate island gates 136a. Each island gate 136a not only covers the charge storage layer 28 on the corresponding comb-teeth portion 134, but also covers the charge storage layer 28 beside the corresponding comb-teeth portion 134 in the area 106. In the area 104, the first patterned conductive layer 136 exposed by the openings 36 is removed until a top surface thereof lower than a top surface of the second contact plugs 222, so that the remaining first patterned conductive layer 136 can serve as second auxiliary gates 136b. In the area 105, one island gate 136a is electrically connected to the adjacent two second auxiliary gates 136b. When a voltage is applied to the island gates 136a, a depletion region can be generated in the semiconductor layers 16 of the stack structures 12a of the comb-teeth portions 134, so as to reduce the turn-on resistance.

Similarly, referring to FIG. 6 and FIG. 6C, the first patterned conductive layer 236 on the first isolation plugs 124 and exposed by the openings 47 in the area 206 is completely removed, so that the remaining first patterned conductive layer 236 can serve as separate island gates 236a. Each island gate 236a not only covers the charge storage layer 28 on the corresponding comb-teeth portion 234, but also covers the charge storage layer 28 beside the corresponding comb-teeth portion 234 in the area 206. In the area 204, the first patterned conductive layer 236 exposed by the openings 46 is removed until a top surface thereof lower than a top surface of the second contact plugs 122, so that the remaining first patterned conductive layer 236 can serve as second auxiliary gates 236b. In the area 205, one island gate 236a is electrically connected to the adjacent two second auxiliary gates 236b. When a voltage is applied to the island gates 236a, a depletion region can be generated in the semiconductor layers 16 of the stack structures 12a of the comb-teeth portion 234, so as to reduce the turn-on resistance. Thereafter, the patterned photoresist layer 34 is removed.

Figure 8:
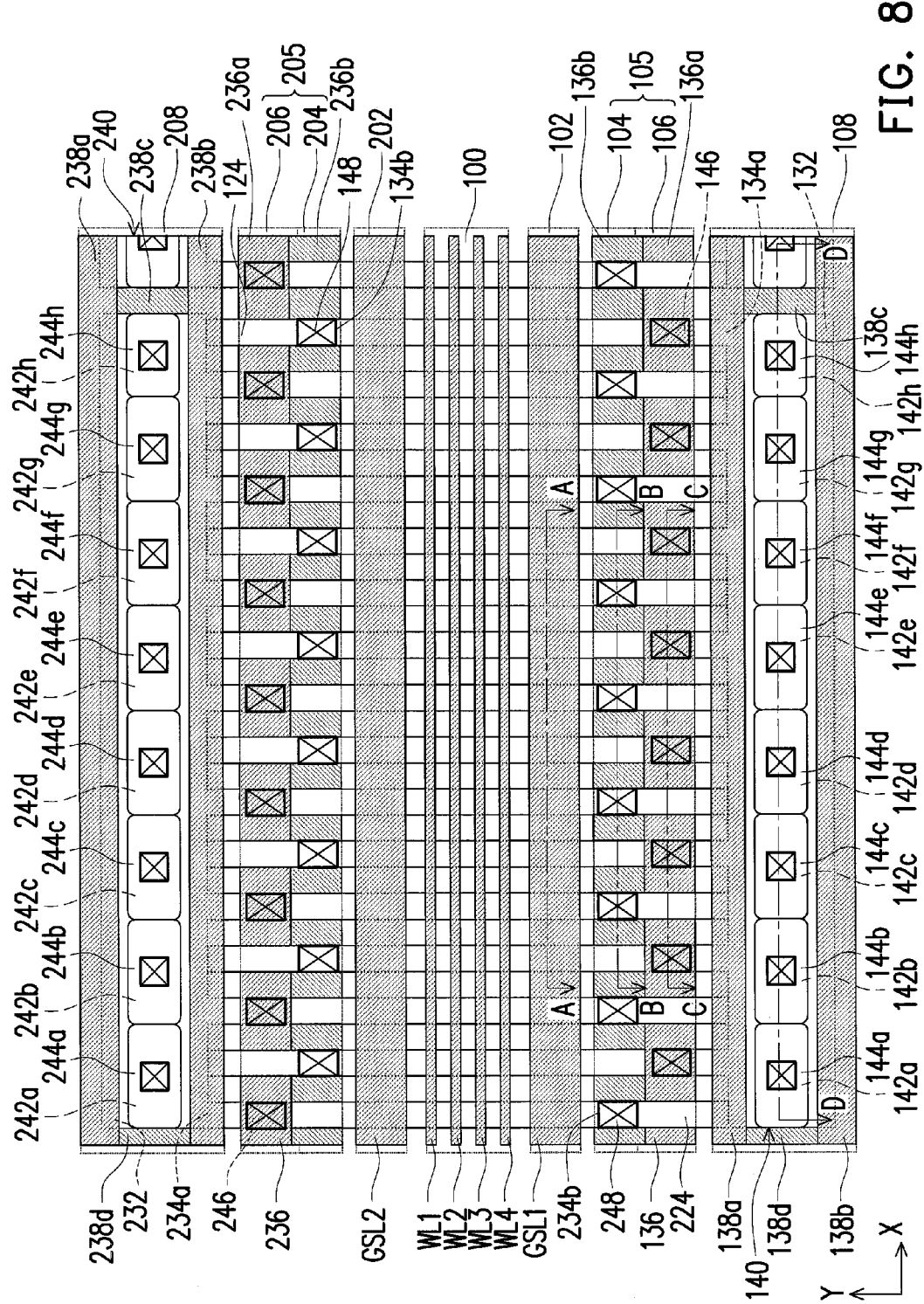
Figure 8A:
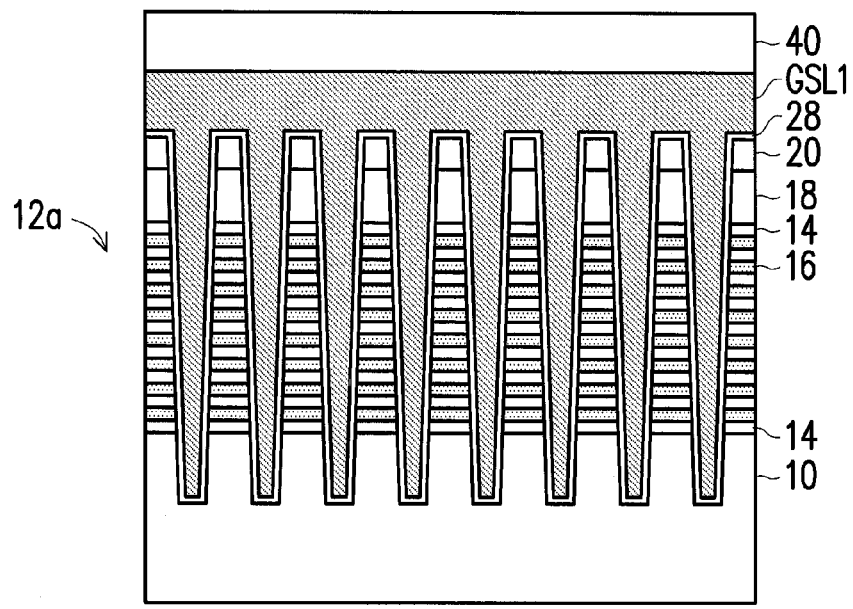
Figure 8B:
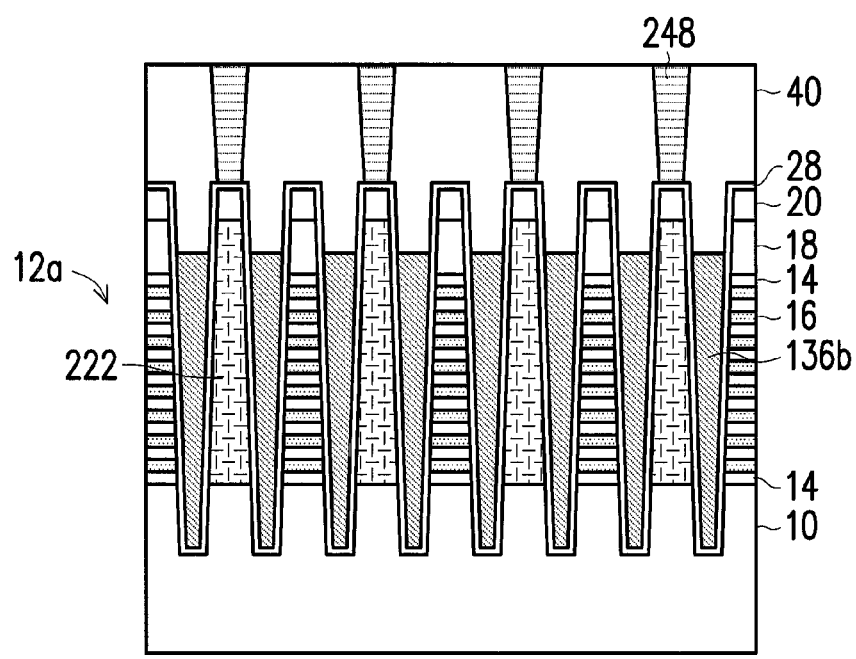
Figure 8C:
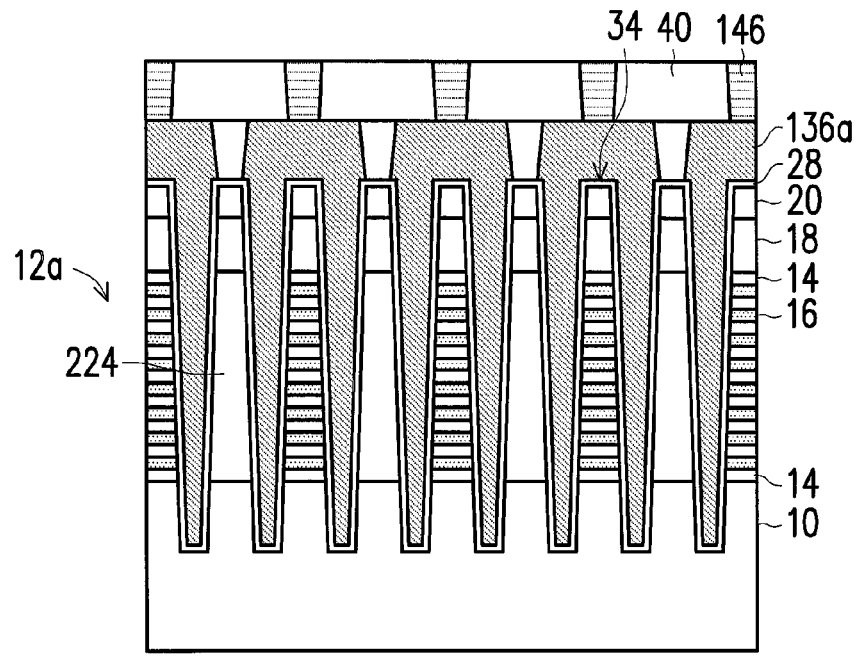
Figure 8D:
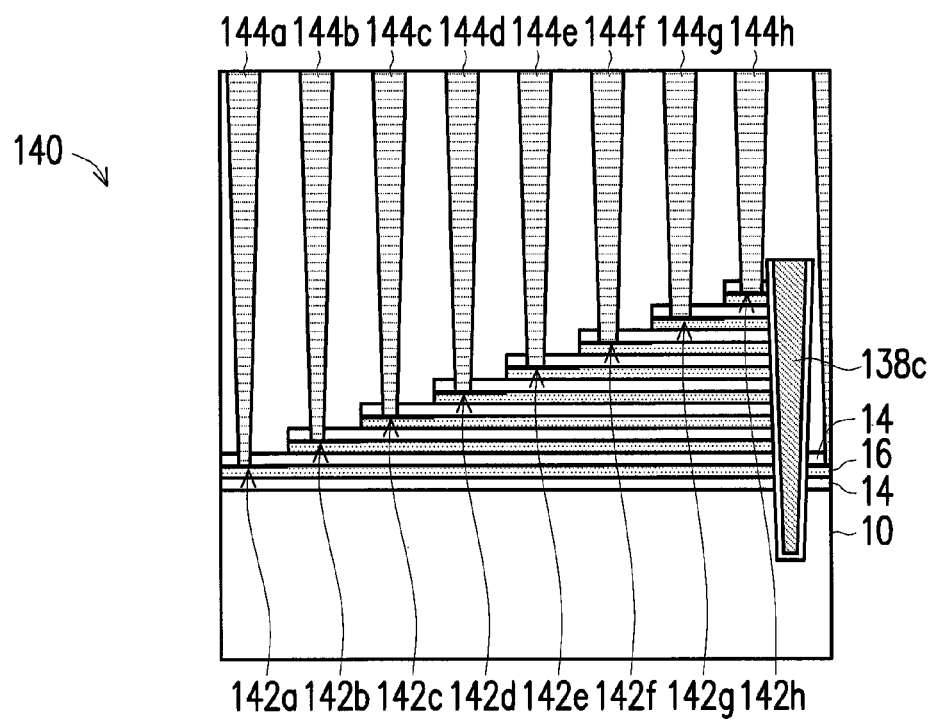

Referring to FIG. 6 to FIG. 6D and FIG. 7 to FIG. 7D, the charge storage layer 28 disposed on the top surfaces of the bit line pads 132 and 232 are removed. Afterwards, the cap layer 20, the cap layer 18, and the stacked structures 12a of the bit line pads 132 and 232 are patterned with multi-stage photolithography and etching processes, so as to form stepped structures 140 and 240. Each step surface of the stepped structures 140 and 240 is an insulating layer 14. Thereafter, an ion implantation process is performed to the stepped structures 140 and 240, so as to form doped regions 142a to 142h respectively in the topmost semiconductor layers below the corresponding step surfaces (insulating layers 14) of the stepped structure 140 and form doped regions 242a to 242h respectively in the topmost semiconductor layers below the corresponding step surfaces (insulating layers 14) of the stepped structure 240. Herein, the doped regions 142a to 142h and 242a to 242h are formed after the formation of the stepped structures 140 and 240 and before the formation of the dielectric layer 40 (as shown in FIG. 8 to FIG. 8D), and the insulating layers 14 on the topmost semiconductor layers 16 of the stepped structures 140 and 240 have substantially the same thickness, and thus, the doped regions 142a to 142h and 242a to 242h have substantially the same junction depth and concentration. Accordingly, the uniformity and reliability of the device can be improved.

Referring to FIG. 8 and FIG. 8D, a dielectric layer 40 is formed on the substrate 10. Thereafter, a plurality of contacts 144, 244, 146, 246, 148 and 248 are formed in the dielectric layer 40. The contacts 144 include contacts 144a to 144h electrically connected to the doped regions 142a to 142h, respectively. The contacts 244 include contacts 244a to 244h electrically connected to the doped regions 242a to 242h, respectively. The contacts 146 and 246 are electrically connected to the island gates 136a and 236b, respectively. The contacts 148 and 248 are electrically connected to the first and second contact plugs 122 and 222, respectively.

Figure 9:
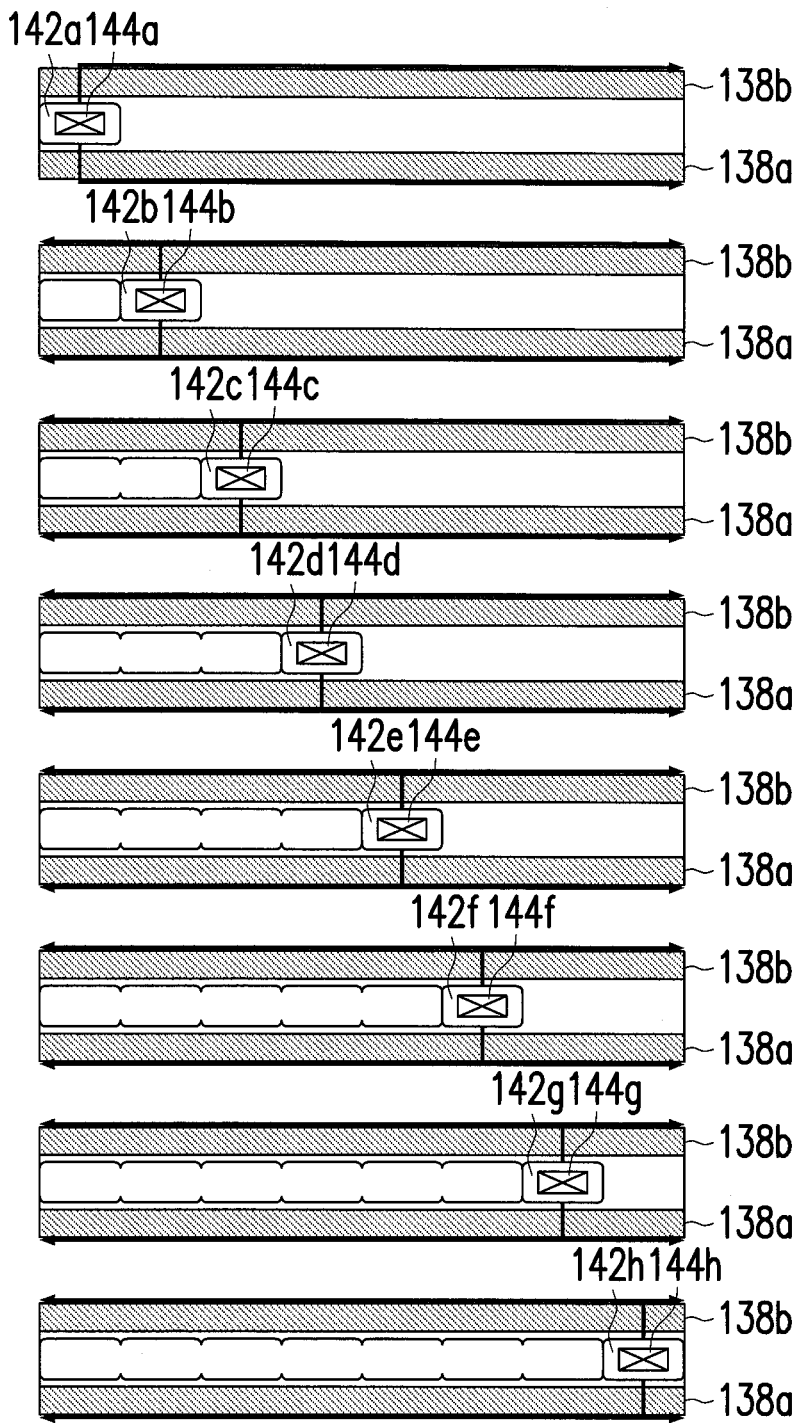
FIG. 9 is a top view illustrating steps of a stepped structure of a bit line pad of a three-dimensional memory according to an embodiment of the present invention.

FIG. 9 is a top view illustrating the steps of the bit line pad 132 of the stepped structure 140.

Referring to FIG. 9, the doped regions 142a to 142h are disposed in the corresponding semiconductor layers 16 at the bottoms of the corresponding contacts 144a to 144h. The doped regions 142a to 142h have substantially the same junction depth and concentration, so that the junction resistance can be reduced and the uniformity and reliability of the device can be improved. The first auxiliary gates 138a and 138b respectively cover the top surface and the sidewall of two edge regions of the bit line pad 132 and cover the charge storage layer 28. When a voltage is applied to the first auxiliary gates 138a and 138b, a channel is formed in the semiconductor layers 16 and a low-resistance path is therefore generated.

The three-dimensional memory of the present invention is illustrated with reference to FIG. 8 to FIG. 8D. The three-dimensional memory of the present invention can be a vertical NAND flash.

The three-dimensional memory of the present invention includes a substrate 10 having a plurality of trenches 26 therein, a plurality of stacked structures 12a, a plurality of doped regions 142a to 142h, a charge storage layer 28, a plurality of word lines WL1 to WL4, two first auxiliary gates 138a and 138b, a plurality of contact plugs 124, a plurality of island gates 136a, a plurality of second auxiliary gates 136b and a plurality of contacts 144a to 144h. The stacked structures 12a are disposed on the substrate 10 between the trenches 26. Each stacked structure 12a includes a plurality of semiconductor layers 16 and a plurality of insulating layers 14 arranged alternately. The stacked structures 12a and the substrate 10 constitute first and second comb structures 130 and 230. The first comb structure 130 includes a bit line pad 132 and a plurality of comb-teeth portions 134. The bit line pad 132 extends along a first direction, and the stacked structure 12a of the bit line pad 132 exhibits a stepped structure 140. The comb-teeth portions 134 extend in a second direction different from the first direction. The semiconductor layers 16 of the comb-teeth portions 134 serve as bit lines. The first end 134a of each comb-teeth portion 134 is connected to the bit line pad 132. The doped regions 142a to 142h are respectively disposed in the semiconductor layers 16 below step surfaces of the stepped structure 140. The charge storage layer 28 covers the top surface and the sidewall of the first comb structure 140. The word lines WL1 to WL4 extend along the first direction. The word lines WL1 to WL4 cover the charge storage layer 28 on the top surface and the sidewall of a portion of the comb-teeth portions in a first area. The first auxiliary gates 138a and 138b extend in the first direction and respectively cover the charge storage layer 28 on the top surface and the sidewall of two edge regions of the bit line pad 132. The contacts 144a to 144h respectively contact the doped regions 142a to 142h. The island gates 136a are separated from each other, arranged along the first direction, and cover the charge storage layer 28 on the top surface and the sidewall of the comb-teeth portions 134 in a second area between the bit line pad 132 and the ground select line GSL1. The second auxiliary gates 136b are disposed on the charge storage layer 28 between the comb-teeth portions 134 in a third area between the island gates 136a and the ground select line GSL1. The top surface of the second auxiliary gates 136b is lower than the top surface of the comb-teeth portions 134, and two second auxiliary gates 136b are connected to one island gate 136a. The second comb structure 230 and related components thereof are similar to the first comb structure 130 and the corresponding components thereof, and the details are not iterated herein.

In summary, in the three-dimensional memory of the invention, each bit line pad has a stepped structure and a doped region is formed at the surface of the corresponding semiconductor layer below each step surface. The doped regions are formed with an ion implantation process after the formation of the stepped structure and before the formation of the dielectric layer, and the insulating layers on the topmost semiconductor layers of the stepped structure have substantially the same thickness, and thus, the doped regions have substantially the same junction depth and concentration. Accordingly, the uniformity and reliability of the device can be improved.

Besides, in the invention, the first auxiliary gates are formed to cover the top surface and the sidewall of edge regions of the bit line pad. When a voltage is applied to the first auxiliary gates, a channel is formed in the semiconductor layers and a low-resistance path is therefore generated to increase the turn-on current.

In addition, the island gates and the second auxiliary gates are further disposed on the charge storage layer between the ground select lines GSL1/GSL2 and the bit line pad. Two second auxiliary gates are disposed beside each comb-teeth portion and electrically connected to one island gate. When a voltage is applied to the island gates, a depletion region can be generated in the semiconductor layers of the stack structures of the comb-teeth portions covered by the island gates and the second auxiliary gates, so as to reduce the turn-on resistance and increase the turn-on current.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a three-dimensional memory, comprising:
   forming a stacked structure on a substrate, wherein the stacked structure comprises a plurality of semiconductor layers and a plurality of insulating layers arranged alternately;
   patterning the stacked structure to form a first comb structure and to form a plurality of trenches in the substrate, wherein the first comb structure comprises a bit line pad extending along a first direction and a plurality of comb-teeth portions extending along a second direction different from the first direction, and a first end of each comb-teeth portion is connected to the bit line pad;
   forming a charge storage layer on a top surface and a sidewall of the first comb structure;
   forming a plurality of bit lines and two first auxiliary gates on the charge storage layer, wherein each word line extends along the first direction and covers the top surface and the sidewall of a portion of the comb-teeth portions in a first area, and the first auxiliary gates extend in the first direction and respectively cover the top surface and the sidewall of two edge regions of the bit line pad;
   removing the charge storage layer on the top surface of the bit line pad, and patterning the stacked structure of the bit line pad to form a stepped structure;
   performing an ion implantation process to the stepped structure, so as to form a doped region in the semiconductor layer below each step surface of the stepped structure; and
   forming a plurality of contacts respectively contacting the doped regions.

2. The method of claim 1, further comprising forming a plurality of separate island gates arranged along the first direction, wherein the island gates cover the charge storage layer on the top surface and the sidewall of the comb-teeth portions in a second area between the bit line pad and the word lines.

3. The method of claim 2, further comprising forming a plurality of second auxiliary gates on the charge storage layer between the comb-teeth portions in a third area between the island gates and the word lines, wherein a top surface of the second auxiliary gates is lower than a top surface of the comb-teeth portions in the third area, and two second auxiliary gates are connected to one island gate.

4. The method of claim 3, wherein the step of forming the first auxiliary gates, the island gates, the second auxiliary gates and the word lines comprises:
   forming a conductive layer on the charge storage layer;
   patterning the conductive layer to form a first patterned conductive layer, a second patterned conductive layer and the word lines, wherein the second patterned conductive layer extends along the first direction and covers the top surface and the sidewall of the bit line pad, and the first patterned conductive layer extends along the first direction, is disposed adjacent to the second patterned conductive layer, and covers the top surface and the sidewall of the comb-teeth portions in the second area and the third area;
   removing the second patterned conductive layer which covers a central region of the bit line pad, so that the remaining second patterned conductive layer on the edge regions of the bit line pad serves as the first auxiliary gates;
   removing a portion of the first patterned conductive layer in the second area to form the island gates; and
   removing a portion of the first patterned conductive layer in the third area to form the second auxiliary gates.

5. The method of claim 1, further comprising forming a first contact plug at a second end of each comb-teeth portion of the first comb structure, wherein the semiconductor layers of each comb-teeth portion of the first comb structure are electrically connected to the substrate through the corresponding first contact plug.

6. The method of claim 5, further comprising:
   forming a second comb structure during the step of patterning the stacked structure, wherein a bit line pad of the second comb structure corresponds to the bit line pad of the first comb structure, and comb-teeth portions of the second comb structure and the comb-teeth portions of the first comb structure are arranged alternately; and
   forming a second contact plug at an end of each comb-teeth portion of the second comb structure, wherein the semiconductor layers of each comb-teeth portion of the second comb structure are electrically connected to the substrate through the corresponding second contact plug.

7. The method of claim 6, further comprising:
   forming a first isolation plug between each first contact plug and the bit line pad of the second comb structure; and
   forming a second isolation plug between each second contact plug and the bit line pad of the first comb structure.

8. A method of forming a three-dimensional memory, comprising:
forming a stacked structure on a substrate, wherein the stacked structure comprises a plurality of semiconductor layers and a plurality of insulating layers arranged alternately;
patterning the stacked structure to form a first comb structure and to form a plurality of trenches in the substrate, wherein the first comb structure comprises a bit line pad extending along a first direction and a plurality of comb-teeth portions extending along a second direction different from the first direction, and a first end of each comb-teeth portion is connected to the bit line pad;
forming a charge storage layer on a top surface and a sidewall of the first comb structure; and
forming a plurality of word lines and a plurality of separate island gates on the charge storage layer, wherein each word line extends along the first direction and covers the top surface and the sidewall of a portion of the comb-teeth portions in a first area, and the island gates are arranged in the first direction and cover the charge storage layer on the top surface and the sidewall of the comb-teeth portions in a second area.

9. The method of claim 8, further comprising forming a plurality of auxiliary gates on the charge storage layer between the comb-teeth portions in a third area between the island gates and the word lines, wherein a top surface of the auxiliary gates is lower than a top surface of the comb-teeth portions in the third area, and two auxiliary gates are connected to one island gate.

10. The method of claim 9, wherein the step of forming the island gates, the auxiliary gates and the word lines comprises:
forming a conductive layer on the charge storage layer;
patterning the conductive layer to form a patterned conductive layer and the word lines, wherein the patterned conductive layer extends along the first direction, and covers the top surface and the sidewall of the comb-teeth portions in the second area and the third area;
removing a portion of the patterned conductive layer in the second area to form the island gates; and
removing a portion of the patterned conductive layer in the third area to form the auxiliary gates.

11. The method of claim 8, further comprising forming a contact plug at a second end of each comb-teeth portion of the first comb structure, wherein the semiconductor layers of each comb-teeth portion of the first comb structure are electrically connected to the substrate through the corresponding contact plug.

12. A three-dimensional memory, comprising:
a substrate, having a plurality of trenches therein;
a plurality of stacked structures, disposed on the substrate between the trenches, wherein each stacked structure comprises a plurality of semiconductor layers and a plurality of insulating layers arranged alternately, and the stacked structures and the substrate constitute a first comb structure comprising:
a bit line pad, extending along a first direction, wherein the stacked structure of the bit line pad exhibits a stepped structure; and
a plurality of comb-teeth portions, extending in a second direction different from the first direction, wherein a first end of each comb-teeth portion is connected to the bit line pad;
a plurality of doped regions, respectively disposed in the semiconductor layers below step surfaces of the stepped structure;
a charge storage layer, covering a top surface and a sidewall on the first comb structure;
a plurality of word lines, extending along the first direction, wherein each word line covers the charge storage layer on the top surface and the sidewall of a portion of the comb-teeth portions in a first area;
two first auxiliary gates, extending in the first direction and respectively covering the charge storage layer on the top surface and the sidewall of two edge regions of the bit line pad; and
a plurality of contacts, respectively contacting the doped regions.

13. The three-dimensional memory of claim 12, wherein junction depths of the doped regions are substantially the same.

14. The three-dimensional memory of claim 12, further comprising a plurality of separate island gates arranged along the first direction and covering the charge storage layer on the top surface and the sidewall of the comb-teeth portions in a second area between the bit line pad and the word lines.

15. The three-dimensional memory of claim 14, further comprising a plurality of second auxiliary gates on the charge storage layer between the comb-teeth portions in a third area between the island gates and the word lines, wherein a top surface of the second auxiliary gates is lower than a top surface of the comb-teeth portions in the third area, and two second auxiliary gates are connected to one island gate.

16. The three-dimensional memory of claim 12, further comprising a first contact plug at a second end of each comb-teeth portion of the first comb structure, wherein the semiconductor layers of each comb-teeth portion of the first comb structure are electrically connected to the substrate through the corresponding first contact plug.

17. The three-dimensional memory of claim 12, further comprising:
a second comb structure, wherein a bit line pad of the second comb structure corresponds to the bit line pad of the first comb structure, and comb-teeth portions of the second comb structure and the comb-teeth portions of the first comb structure are arranged alternately; and
a second contact plug, disposed at an end of each comb-teeth portion of the second comb structure, wherein the semiconductor layers of each comb-teeth portion of the second comb structure are electrically connected to the substrate through the corresponding second contact plug.

18. The three-dimensional memory of claim 17, further comprising:
a first isolation plug, disposed between each first contact plug and the bit line pad of the second comb structure; and
a second isolation plug, disposed between each second contact plug and the bit line pad of the first comb structure.

19. A three-dimensional memory, comprising:
a substrate, having a plurality of trenches therein;
a plurality of stacked structures, disposed on the substrate between the trenches, wherein each stacked structure comprises a plurality of semiconductor layers and a plurality of insulating layers arranged alternately, and the stacked structures and the substrate constitute a first comb structure comprising:
a bit line pad, extending along a first direction, wherein the stacked structure of the bit line pad exhibits a stepped structure; and a plurality of comb-teeth portions, extending in a second direction different from the first direction, wherein a first end of each comb-teeth portion is connected to the bit line pad;

a plurality of doped regions, respectively disposed in the semiconductor layers below step surfaces of the stepped structure;

a charge storage layer, covering a top surface and a sidewall of the first comb structure;

a plurality of word lines, extending along the first direction, wherein each word line covers the charge storage layer on the top surface and the sidewall of a portion of the comb-teeth portions in a first area; and a plurality of separate island gates, arranged in the first direction and covering the charge storage layer on top surface and the sidewall of the comb-teeth portions in a second area between the bit line pad and the word lines.

20. The three-dimensional memory of claim 19, wherein junction depths of the doped regions are substantially the same.

21. The three-dimensional memory of claim 19, further comprising a plurality of auxiliary gates on the charge storage layer between the comb-teeth portions in a third area between the island gates and the word lines, wherein a top surface of the auxiliary gates is lower than a top surface of the comb-teeth portions in the third area, and two auxiliary gates are connected to one island gate.

22. The three-dimensional memory of claim 19, further comprising a contact plug at a second end of each comb-teeth portion of the first comb structure, wherein the semiconductor layers of each comb-teeth portion of the first comb structure are electrically connected to the substrate through the corresponding contact plug.

* * * * *